(12) United States Patent
Ohnuma et al.

(10) Patent No.: US 8,293,626 B2
(45) Date of Patent: Oct. 23, 2012

(54) METHOD FOR MANUFACTURING SEMICONDUCTOR DEVICE

(75) Inventors: Hideto Ohnuma, Atsugi (JP); Naoki Okuno, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 66 days.

(21) Appl. No.: 12/552,493

(22) Filed: Sep. 2, 2009

(65) Prior Publication Data

US 2010/0062586 A1 Mar. 11, 2010

(30) Foreign Application Priority Data

Sep. 5, 2008 (JP) ................................. 2008-228134

(51) Int. Cl.
*H01L 21/00* (2006.01)

(52) U.S. Cl. ........ 438/482; 438/162; 438/164; 438/166; 438/484; 438/485; 438/486; 438/487; 438/763; 438/764; 438/778; 438/795; 438/798; 438/928; 438/967; 438/969; 257/E21.09

(58) Field of Classification Search ............. 257/E21.09; 438/479, 482, 486, 488
See application file for complete search history.

(56) References Cited

U.S. PATENT DOCUMENTS

| 5,608,232 | A | 3/1997 | Yamazaki et al. | |
| 5,639,698 | A | 6/1997 | Yamazaki et al. | |
| 5,897,347 | A | 4/1999 | Yamazaki et al. | |
| 5,956,579 | A | 9/1999 | Yamazaki et al. | |
| 6,084,247 | A | 7/2000 | Yamazaki et al. | |
| 6,111,191 | A * | 8/2000 | Hall et al. | 136/258 |
| 6,759,284 | B2 * | 7/2004 | Kang et al. | 438/151 |
| 6,997,985 | B1 | 2/2006 | Yamazaki et al. | |
| 7,122,450 | B2 * | 10/2006 | Yamazaki et al. | 438/486 |
| 2001/0031541 | A1 * | 10/2001 | Madan et al. | 438/482 |
| 2002/0164843 | A1 * | 11/2002 | Yamazaki et al. | 438/166 |
| 2006/0017052 | A1 * | 1/2006 | Kakkad | 257/66 |
| 2007/0190340 | A1 * | 8/2007 | Coppola et al. | 428/432 |

FOREIGN PATENT DOCUMENTS

| JP | 63-042112 A | 2/1988 |
| JP | 06-244103 A | 9/1994 |

* cited by examiner

*Primary Examiner* — Charles Garber
*Assistant Examiner* — Yasser Abdelaziez
(74) *Attorney, Agent, or Firm* — Eric J. Robinson; Robinson Intellectual Property Law Office, P.C.

(57) ABSTRACT

It is an object to provide a homogeneous semiconductor film in which variation in the size of crystal grains is reduced. Alternatively, it is an object to provide a homogeneous semiconductor film and to achieve cost reduction. By introducing a glass substrate over which an amorphous semiconductor film is formed into a treatment atmosphere set at more than or equal to a temperature that is needed for crystallization, rapid heating due to heat conduction from the treatment atmosphere is performed so that the amorphous semiconductor film is crystallized. More specifically, for example, after the temperature of the treatment atmosphere is increased in advance to a temperature that is needed for crystallization, the substrate over which the semiconductor film is formed is put into the treatment atmosphere.

37 Claims, 15 Drawing Sheets

FIG. 7A
FIG. 7B
FIG. 7C
FIG. 7D
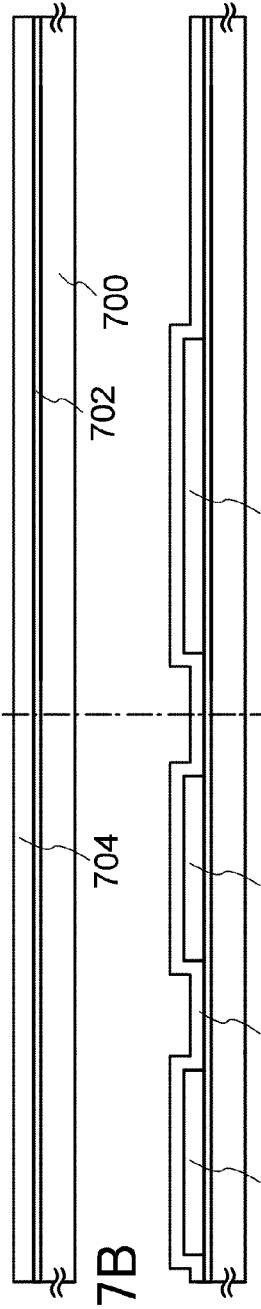
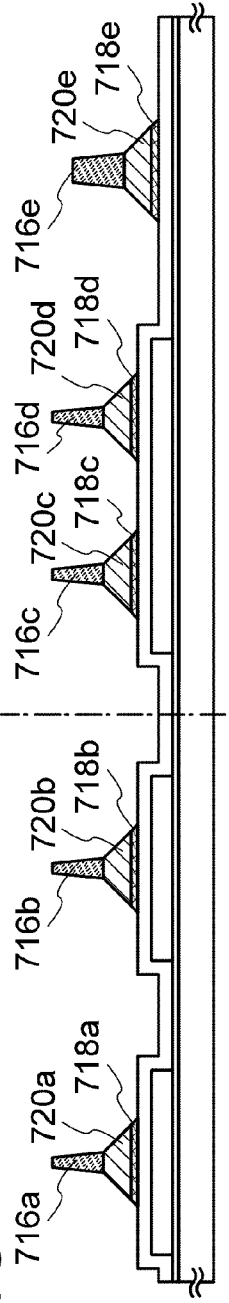
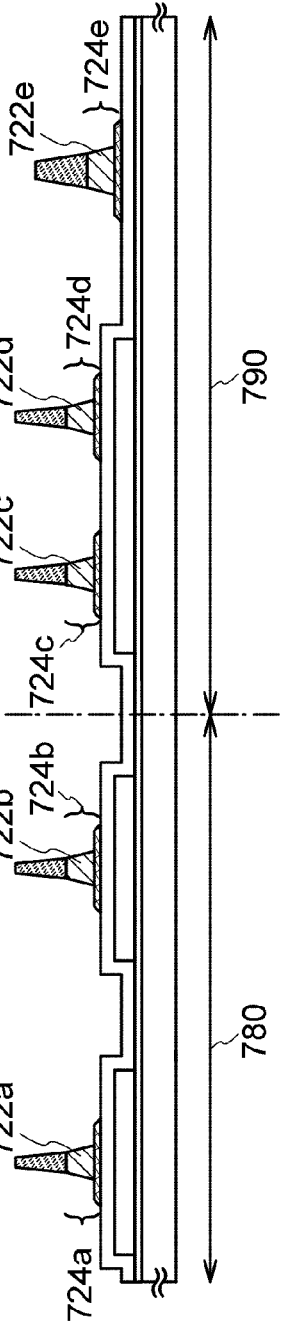

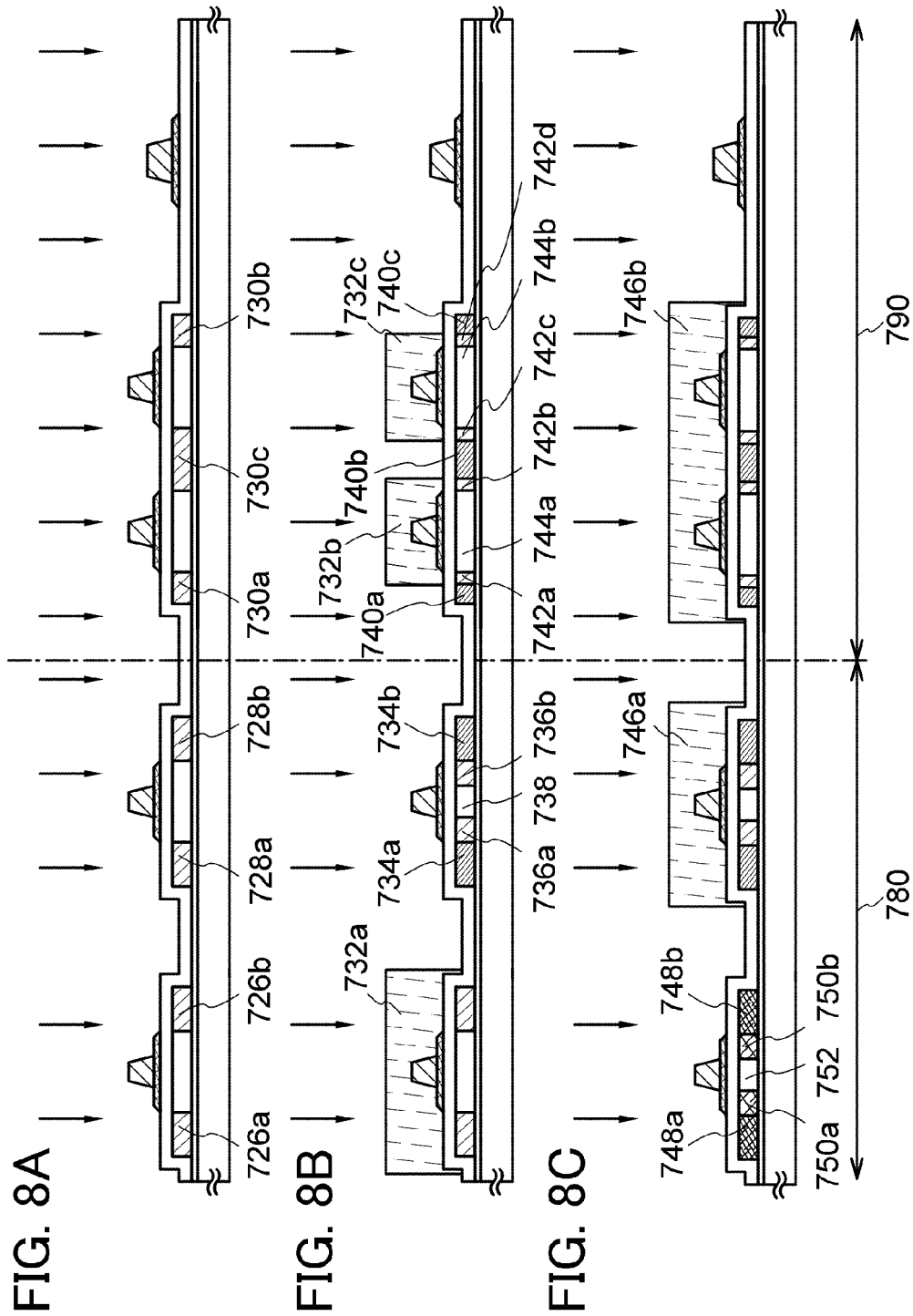

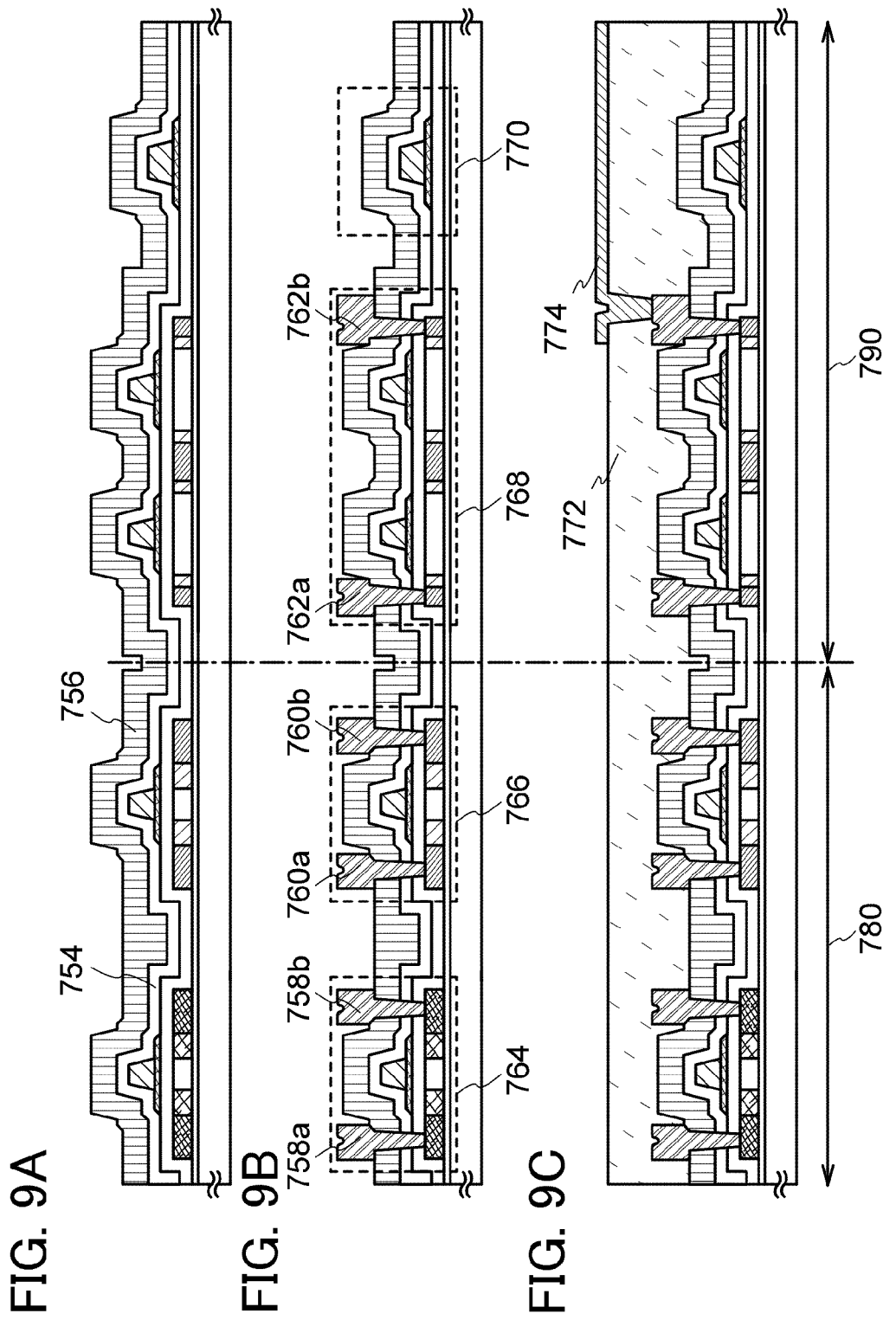

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

In recent years, a thin-shaped display device typified by a liquid crystal display device or an electro luminescent display device (also referred to as an EL display device) has become popular; accordingly, a thin film transistor technology, which is one of its main technologies, has been actively researched and developed. By improving performance of a thin film transistor and increasing productivity thereof, a thin-shaped display device having excellent display performance can be provided at low cost. Accordingly, such a thin-shaped display device can maintain advantage in the market of thin-shaped display devices.

As an example of a method for improving performance of a thin film transistor, a method in which crystallinity of a semiconductor film is improved is given. In Patent Document 1, for example, a technique in which a nickel element is added to silicon to promote crystallization, thereby improving characteristics of a thin film transistor is disclosed.

Further, in Patent Document 2, a technique in which crystallization of a semiconductor film is promoted by heat treatment at multiple steps is disclosed.

REFERENCE

[Patent Document 1] Japanese Patent Laid-Open No. H06-244103
[Patent Document 2] Japanese Patent Laid-Open No. S63-042112

SUMMARY OF THE INVENTION

However, for example, when the technique described in Patent Document 1 or the like is used, there is a case where a metal element which promotes crystallization of a semiconductor (also referred to as a catalytic element), such as nickel, adversely affects electrical characteristics of a thin film transistor. Moreover, the number of steps is increased by use of the catalytic element and thus production cost is increased.

Meanwhile, when heat treatment at multiple steps disclosed in Patent Document 2 is performed, the size of crystal grains varies, which causes a problem that it is difficult to obtain a homogeneous semiconductor film.

For example, a case where a semiconductor film is crystallized by heat treatment using an electric furnace is considered. In general, in the case of performing heating by an electric furnace, stepwise heat treatment in which a temperature is gradually increased is performed in consideration of damage to a substrate due to rapid heating. In this case, at a transitional temperature (for example, 500° C. or more) before reaching a final heat treatment temperature, crystal nuclei are locally generated in part of the semiconductor film and crystal growth occurs. As a result, crystal grains having an even size cannot be formed on an entire surface of the semiconductor film. In the case of thus causing crystallization by increasing a temperature in stages, nuclei are generated partially and the size of crystal grains varies.

Further, a case where a semiconductor film is crystallized by an RTA (rapid thermal anneal) apparatus using lamp light is considered. In general, heating by an RTA apparatus using lamp light is performed by making a semiconductor film absorb lamp light so as to heat the semiconductor film itself.

However, a thickness of a semiconductor film used for a thin film transistor is approximately several hundred nm at most, which is not thick enough that the semiconductor film can absorb lamp light. Therefore, it is difficult to realize rapid heating. That is, even in the case of crystallization by an RTA apparatus using lamp light, a semiconductor film is gradually heated and thus the size of crystal grains varies as in the case of using an electric furnace.

Accordingly, the above-described methods have a problem that it is difficult to obtain a homogeneous semiconductor film due to variation in the size of crystal grains. In addition, since the number of steps and time required for a process increase, it is difficult to say that the above-described methods are favorable in terms of productivity.

In consideration of the above-described problems, in an embodiment of the invention to be disclosed, it is an object to provide a homogeneous semiconductor film in which variation in the size of crystal grains is reduced. Alternatively, an object is to provide a homogeneous semiconductor film and to achieve cost reduction.

In an embodiment of the invention to be disclosed, by introducing a glass substrate over which an amorphous semiconductor film is formed into a treatment atmosphere whose temperature is higher than or equal to a temperature necessary for crystallization, rapid heating is performed by heat conduction from the treatment atmosphere so that the amorphous semiconductor film is crystallized.

Specifically, a temperature of a treatment atmosphere is increased to a temperature necessary for crystallization in advance, and then a substrate over which a semiconductor film is formed is put into the treatment atmosphere. Accordingly, temperatures of the semiconductor film and the substrate are rapidly increased to the temperature necessary for crystallization due to heat conduction from the treatment atmosphere.

Note that in an embodiment of the invention to be disclosed, a glass substrate whose strain point is higher than the temperature necessary for crystallization is preferably used in the case where damage to the substrate due to rapid heating is considered.

In addition, in an embodiment of the invention to be disclosed, an amorphous semiconductor film in which a catalytic element for crystallization is not contained intentionally is preferably used in the case where reduction of production cost is considered.

In a method for manufacturing a semiconductor device, according to an embodiment of the invention to be disclosed, an amorphous semiconductor film is formed over a glass substrate, and the glass substrate is introduced into a treatment atmosphere after setting a temperature of the treatment atmosphere at 725° C. or more to crystallize the amorphous semiconductor film.

In another method for manufacturing a semiconductor device, according to an embodiment of the invention to be disclosed, an amorphous semiconductor film is formed over a glass substrate, the glass substrate is introduced into a treatment atmosphere after setting a temperature of the treatment atmosphere at 725° C. or more and held for a predetermined time to crystallize the amorphous semiconductor film, and the glass substrate is taken out of the treatment atmosphere.

Note that the above predetermined time is preferably from 1 minute to 10 minutes. Further, the above holding is preferably conducted at a temperature which is lower than a strain point of the glass substrate.

In the above description, a temperature of the treatment atmosphere is preferably set at higher than or equal to 725° C. and lower than the strain point of the glass substrate. Moreover, in the above description, the temperature of the treatment atmosphere may be set at higher than or equal to 725° C. and higher than or equal to the strain point of the glass substrate.

Further, the above treatment atmosphere preferably contains at least any one of hydrogen, helium, or water vapor. Alternatively, a mixed atmosphere which contains any two of hydrogen, helium, and water vapor may be employed.

In addition, in the above description, the temperature of the treatment atmosphere is preferably held by radiant heat.

Note that the strain point of the glass substrate is preferably 730° C. or more, and the glass substrate preferably contains BaO and $B_2O_3$ so that the amount of BaO is larger than that of $B_2O_3$.

In an embodiment of the invention to be disclosed, a glass substrate over which an amorphous semiconductor film is formed is introduced into a treatment atmosphere whose temperature is set at a predetermined temperature. Accordingly, rapid heating is realized as compared with the case where a temperature is increased in stages. Therefore, crystal nuclei are evenly generated on an entire surface of the semiconductor film and thus variation in the size of crystal grains can be reduced. Further, since a crystalline semiconductor film can be formed without using a catalytic element (intentionally), increase of the number of steps can be suppressed and productivity of a semiconductor device can be increased. Furthermore, time required for a process can be shortened as compared with the case of performing heating in stages or the like; therefore, productivity of a semiconductor device can be increased.

BRIEF DESCRIPTION OF THE DRAWINGS

In the accompanying drawings:

FIGS. 7A to 7D are views illustrating an example of a method for manufacturing a semiconductor device;

FIGS. 8A to 8C are views illustrating an example of a method for manufacturing a semiconductor device;

FIGS. 9A to 9C are views illustrating an example of a method for manufacturing a semiconductor device;

DETAILED DESCRIPTION OF THE INVENTION

Figure 1A:
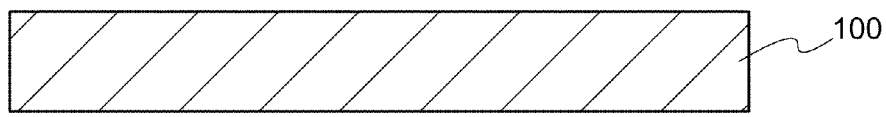
FIGS. 1A to 1E are views illustrating an example of a method for manufacturing a semiconductor device.

Embodiments and an example will be described below with reference to the drawings. However, the invention is not limited to description of the embodiments described below. It is easily understood by those skilled in the art that the mode and detail can be variously changed and modified unless departing from the spirit of the invention. Further, structures according to different embodiments can be implemented by being combined as appropriate. Note that in structures of the invention described below, the same reference numeral refers to the same parts or parts having similar functions, and repeated description thereof is omitted.

Embodiment 1

In this embodiment, an example of a method for manufacturing a semiconductor substrate used for a semiconductor device will be described with reference to FIGS. 1A to 1E, FIG. 2, and FIG. 3.

First, a glass substrate 100 is prepared (see FIG. 1A). Although there is no particular limitation on a glass substrate which can be used, it is necessary that the glass substrate have at least enough heat resistance to heat treatment to be performed later. As the glass substrate 100, for example, the one whose strain point is 730° C. or more is preferably used. Further, as a material of the glass substrate 100, for example, a glass material such as aluminosilicate glass, aluminoborosilicate glass, or barium borosilicate glass is used. Note that in general, heat resistance of glass is increased when much boron trioxide ($B_2O_3$) is contained; however, a more practical glass substrate with heat resistance can be obtained by containing barium oxide (BaO) and boron trioxide so that the amount of BaO is larger than that of $B_2O_3$. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the glass substrate 100. Alternatively, crystallized glass or the like may be used.

Figure 1B:
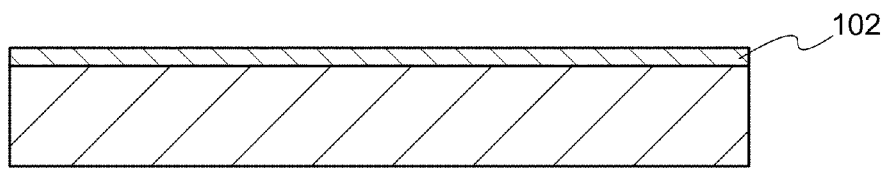

Next, an insulating film 102 is formed over a surface of the glass substrate 100 (see FIG. 1B). By providing the insulating film 102, even in the case where impurities (such as alkali metal or alkaline earth metal) are included in the glass substrate 100, the impurities can be prevented from being diffused into a semiconductor film. The insulating film 102 may have a single-layer structure or a layered structure. As a material for forming the insulating film 102, silicon oxide, silicon nitride, silicon oxynitride, silicon nitride oxide, and the like can be given. Alternatively, a material obtained by adding a halogen element such as fluorine or chlorine to the above insulating material (such as silicon oxide) may be used. Since impurities are fixed by the halogen element, the impurities can be prevented from being diffused into a semiconductor film.

Here, silicon oxynitride means the one that contains oxygen and nitrogen so that the amount of oxygen is larger than that of nitrogen and includes, for example, oxygen, nitrogen, silicon, and hydrogen at concentrations of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, silicon nitride oxide means the one that contains nitrogen and oxygen so that the amount of nitrogen is larger than that of oxygen and includes, for example, oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. Note that the above ranges are ranges for cases where measurement is performed using Rutherford backscattering spectrometry (RBS) and hydrogen forward scattering spectrometry (HFS). Further, the total for the content ratio of the constituent elements does not exceed 100 at. %.

In this embodiment, silicon nitride oxide is used for the insulating film 102. Note that in the case where influence of impurities from the glass substrate 100 is not large, a structure in which the insulating film 102 is not formed may be employed.

Figure 1C:
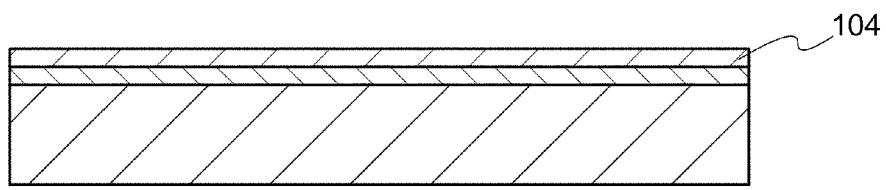

Next, a semiconductor film 104 is formed over the insulating film 102 (see FIG. 1C). Although an amorphous semiconductor film is preferably formed as the semiconductor film 104, there is no particular limitation thereon.

In the case where an amorphous silicon film is formed as the semiconductor film 104, it can be formed by a plasma CVD method using a gas of a silicon compound such as $SiH_4$, $Si_2H_6$, $SiH_2Cl_2$, $SiHCl_3$, $SiCl_4$, or $SiF_4$. Alternatively, the above gas of the silicon compound diluted with one kind or plural kinds of rare gases selected from helium, argon, krypton, and neon may be used. As a method other than a plasma CVD method, for example, a sputtering method using an amorphous semiconductor as a target can be employed. As an atmosphere for sputtering, a hydrogen atmosphere or a rare gas atmosphere is preferable; however, the atmosphere for sputtering is not limited thereto. Note that a thickness of the amorphous semiconductor film is preferably set to be greater than or equal to 2 nm and less than or equal to 200 nm; however, the thickness of the amorphous semiconductor film is not limited thereto.

A microcrystalline semiconductor film may be formed as the semiconductor film 104. In this case, for example, a high-frequency plasma CVD method with a frequency of several ten MHz to several hundred MHz or a microwave plasma CVD method with a frequency of 1 GHz or more can be employed. As a source gas for the case where a microcrystalline semiconductor film is formed, a silicon compound which is typified by $SiH_4$, $Si_2H_6$, $SiH_2Cl_2$, $SiHCl_3$, $SiCl_4$, $SiF_4$, and the like and which is diluted with hydrogen can be used. One kind or plural kinds of rare gas elements selected from helium, argon, krypton, and neon may be added to the above-described silicon compound or hydrogen.

In this embodiment, an amorphous silicon film is formed to a thickness of 50 nm as the semiconductor film 104. Note that an embodiment of the invention to be disclosed should not be interpreted as being limited thereto.

Figure 1D:
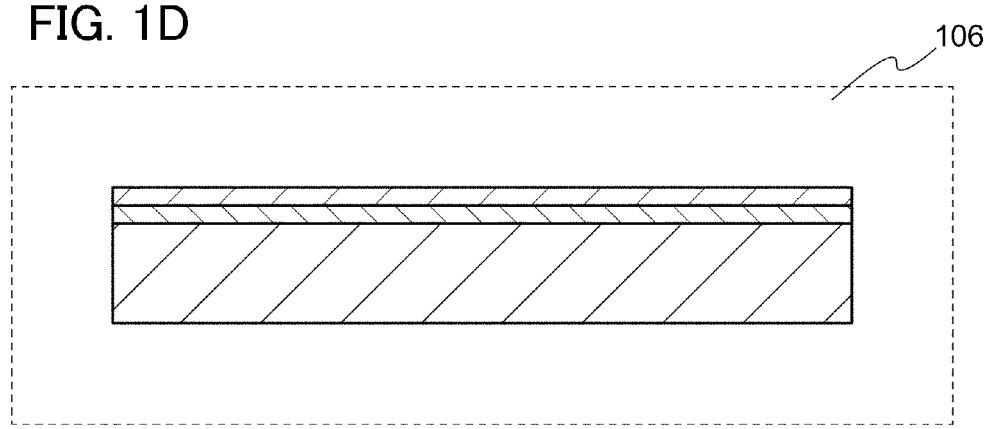

Next, the glass substrate 100 over which the above semiconductor film 104 is formed is introduced into a treatment atmosphere 106 in which a temperature is set at higher than or equal to 725° C. and lower than a strain point of the glass substrate 100 (see FIG. 1D). Accordingly, crystallization of the semiconductor film 104 proceeds. Note that as a result of research of the present inventors, it is confirmed that crystallization in an extremely short time (within approximately 10 minutes or less) is possible by setting the temperature of the glass substrate 100 at 725° C. or more. Therefore, it can be said that the temperature of the above atmosphere is preferably set at 725° C. or more.

The crystallization of the semiconductor film 104 proceeds due to generation of crystal nuclei (also referred to as spontaneous nuclei) caused by an increase of a treatment temperature, and due to crystal growth based on the crystal nuclei. Here, it is confirmed that in the case where the temperature of the treatment atmosphere is set at 725° C. or more in particular, crystal nuclei are generated uniformly and crystallization proceeds. It is understood that this is because rapid heating enables crystal nuclei to be evenly generated on an entire surface, and holding the substrate at a predetermined temperature or more enables crystals to be quickly grown before another crystal nucleus is generated.

On the contrary, for example, in the case where a temperature is increased gradually (heating is performed in stages) after the glass substrate 100 is put into the treatment atmosphere (the atmosphere whose temperature is less than 725° C.), crystal nuclei are partially generated and crystal growth occurs at a transitional temperature (a temperature of approximately 500° C. or more), so that crystal grains having an even size cannot be formed on an entire surface of the semiconductor film 104. Thus, in the case where the temperature reaches 725° C. without rapid heating, the size of crystal grains varies due to generation of crystal nuclei and crystal growth at a temperature less than 725° C.

Therefore, in this embodiment, the semiconductor film 104 is introduced into a treatment atmosphere in which a temperature is set at a predetermined temperature (a temperature at which crystal nuclei are evenly generated in the semiconductor film) in advance so as to be crystallized. Specifically, the glass substrate 100 over which the semiconductor film 104 is formed is introduced into a treatment atmosphere whose temperature is 725° C. or more, and thus the semiconductor film 104 is crystallized. As a result, in crystallization of the semiconductor film 104, crystal growth of the semiconductor film 104 can proceed based on crystal nuclei which are evenly generated, so that a homogeneous crystalline semiconductor film in which variation in the size of crystal grains is reduced (the size of crystal grains is homogeneous) can be formed.

Note that in the case where the temperature of the treatment atmosphere is set at 730° C. or more, homogeneity of a crystalline semiconductor film to be formed is further improved. This is because as a temperature is higher, probability of generation of crystal nuclei is increased and progress of crystal growth is accelerated, and thus relatively small crystal grains are evenly formed on the entire surface of the semiconductor film 104. Therefore, if homogeneity of the crystalline semiconductor film is required, it can be said that the temperature of the treatment atmosphere is preferably set at 730° C. or more.

In addition, when the glass substrate 100 over which the amorphous semiconductor film is formed is introduced into a treatment atmosphere heated to a predetermined temperature in advance so that crystallization is caused in this manner, a treatment time can be shortened.

Specifically, after introducing the glass substrate into the treatment atmosphere 106, the temperature of the glass substrate 100 reaches around the temperature of the atmosphere within 3 minutes. After that, by holding the substrate in the above atmosphere for approximately 1 minute to 10 minutes, preferably 3 minutes to 10 minutes, crystallization of the semiconductor film is completed. Accordingly, a homogeneous semiconductor film can be formed in a short time.

The above treatment atmosphere 106 can be realized using a heat treatment apparatus such as an RTA (rapid thermal anneal) apparatus, a furnace, or a millimeter wave heating apparatus. As a heating method of the heat treatment apparatus, a resistance heating method, a lamp heating method, a gas heating method, an electromagnetic wave heating method, and the like can be given.

Figure 1E:
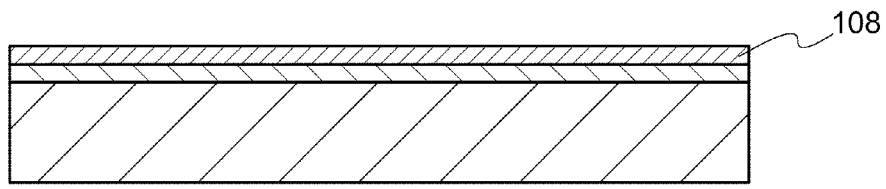

After that, the glass substrate 100 is taken out of the above treatment atmosphere, and thus a structure body (a substrate) in which a crystalline semiconductor film 108 is formed over the glass substrate 100 is obtained (see FIG. 1E). Here, the substrate taken out of the treatment atmosphere is preferably put in an atmosphere whose temperature is set at a normal temperature. By setting the temperature of the atmosphere at a normal temperature, the glass substrate 100 taken out can be cooled without particularly consuming energy. Note that a "normal temperature" here is 20° C.±15° C. (see JIS Z 8703).

Here, an example of a heat treatment apparatus which can be used for realizing the above treatment atmosphere 106 is described.

Figure 2:
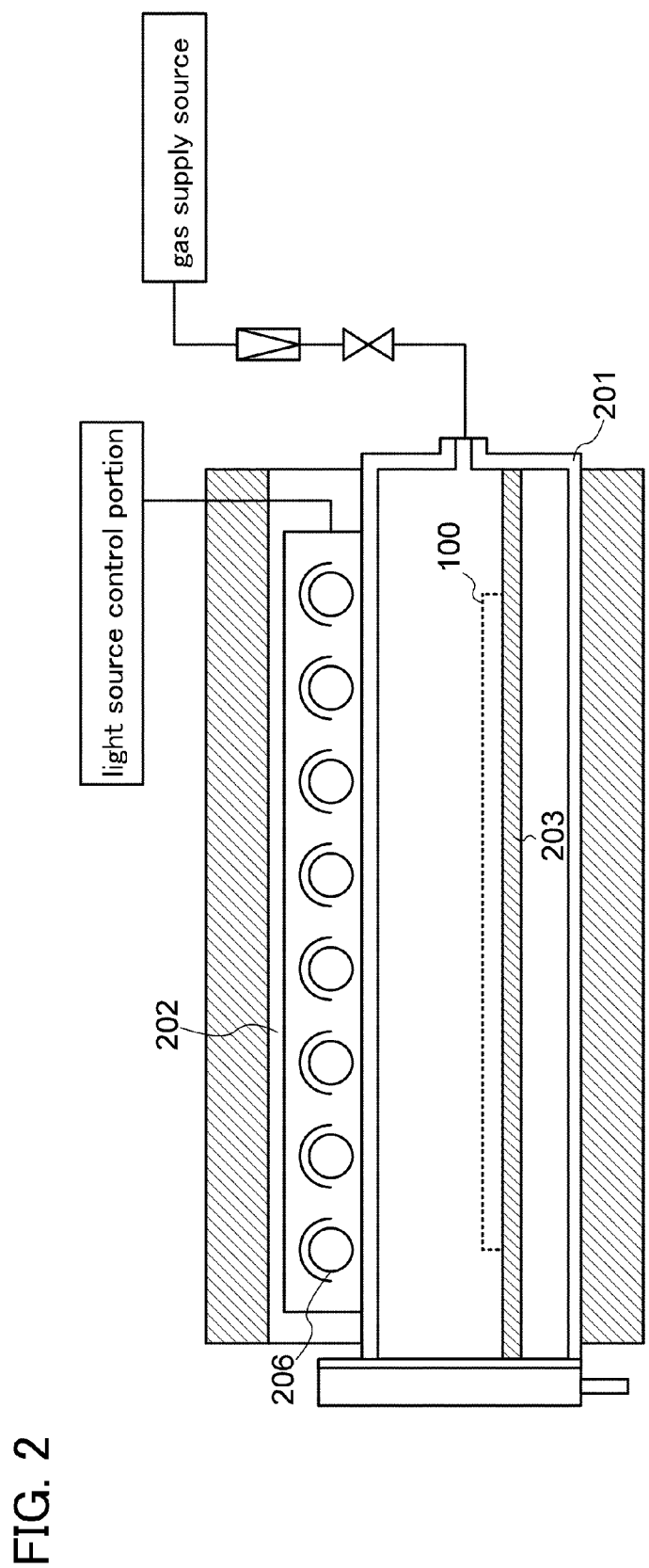
FIG. 2 is a diagram illustrating an example of a heat treatment apparatus used for manufacturing a semiconductor device.

A heat treatment apparatus illustrated in FIG. 2 includes a treatment chamber 201, a heating means 202 which heats the glass substrate 100, and a supporting base 203 which supports the glass substrate 100 in the treatment chamber 201.

The treatment chamber 201 is a place in which heat treatment is performed on the semiconductor film 104 (and the glass substrate 100). By setting a temperature of its atmosphere (a treatment atmosphere) at 725° C. or more (alternatively, higher than or equal to 725° C. and lower than the strain point of glass), an embodiment of the invention to be disclosed is realized. In addition, an inner wall of the treatment chamber 201 can be formed using quartz or the like. Note that a gas such as nitrogen, oxygen, or a rare gas is supplied to the treatment chamber 201 from a gas supply source. Accordingly, a structure of the treatment atmosphere can be changed, and a temperature of the treatment atmosphere can be controlled. Note that the treatment atmosphere preferably contains a gas having high thermal conductivity in order to realize rapid heating which is a feature of the invention. As such a gas, for example, hydrogen, helium, water vapor, and the like can be given. Note that mixture of any of the above gasses having high thermal conductivity may be used. Accordingly, a disadvantage of each gas can be suppressed while an advantage of each gas is utilized.

The heating means 202 may be anything which can heat the atmosphere of the treatment chamber 201 and the glass substrate 100 provided inside the treatment chamber 201. Heating by the heating means 202 may be performed by a method using a high temperature gas, a method using lamp light, or a method using resistance.

An example of a lamp heating method by which heat treatment is performed using a plurality of lamp light sources 206 is illustrated in FIG. 2. Note that the lamp light source 206 is provided with a reflecting plate, and an efficient heating can be performed. As the lamp light source 206, for example, a rod-shaped halogen lamp can be used. In addition, the lamp light source 206 is controlled by a light source control portion.

In an embodiment of the invention to be disclosed, the temperature of the treatment chamber 201 is increased before the glass substrate 100 is introduced into the treatment chamber 201. For example, by irradiating the supporting base 203 with lamp light, the atmosphere is heated by radiant heat. Accordingly, rapid heating of the semiconductor film 104 (and the glass substrate 100) is possible, so that a crystalline semiconductor film in which variation is extremely small can be formed.

Note that in an embodiment of the invention to be disclosed, a "treatment atmosphere" is set at a predetermined temperature; however, the "treatment atmosphere" here may be understood as a concept including all elements that affect the temperature of the glass substrate 100. In this meaning, the "treatment atmosphere" is not necessarily interpreted as being limited to a "gas" existing around the glass substrate 100. For example, in the above heat treatment apparatus, the treatment atmosphere may be understood as a concept including the supporting base 203 which is in contact with the glass substrate 100.

Figure 3:
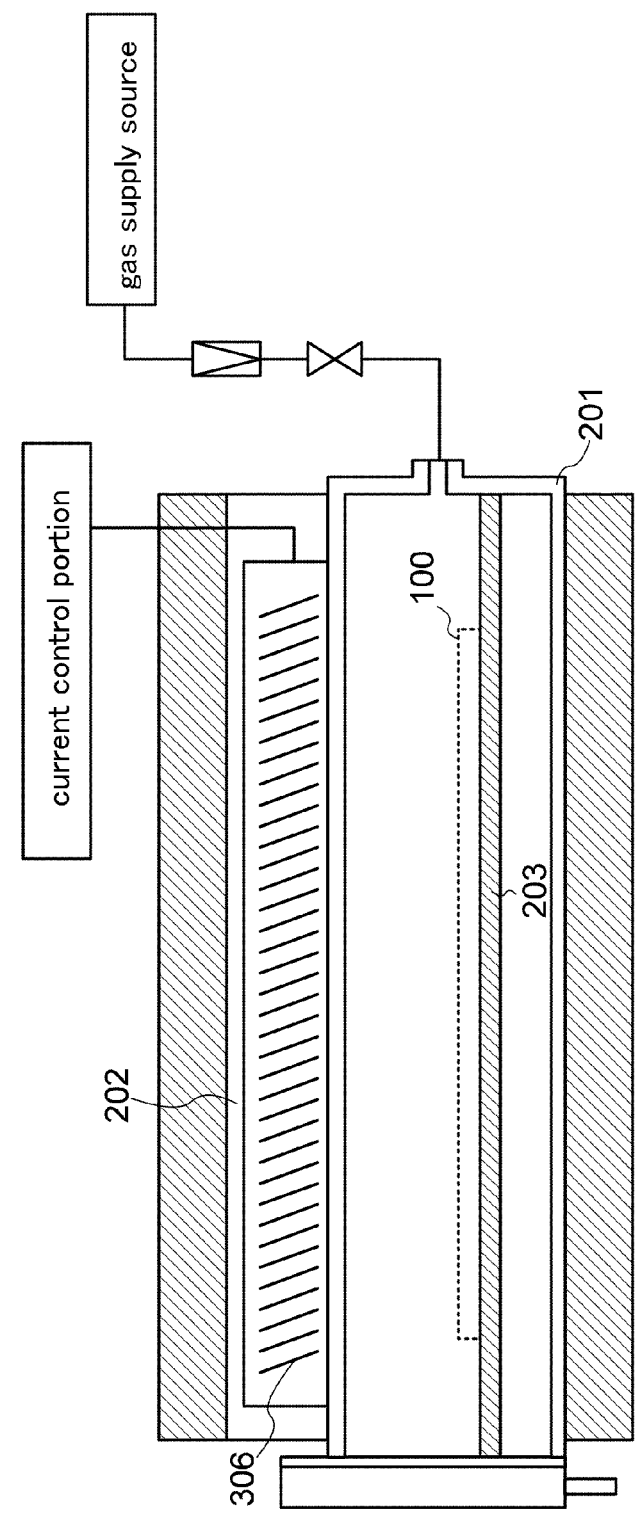
FIG. 3 is a diagram illustrating an example of a heat treatment apparatus used for manufacturing a semiconductor device.

A heat treatment apparatus using a resistance heating method is illustrated in FIG. 3. The heat treatment apparatus is the one in which the lamp light source 206 in the heat treatment apparatus in FIG. 2 is replaced with a resistor 306. By applying charge to the resistor 306, Joule heat is generated, and thus the atmosphere of the treatment chamber 201 and the glass substrate 100 can be heated.

In this embodiment, a method using lamp light and a method using resistance heating are described; however, the invention to be disclosed is not interpreted as being limited thereto. Any heat treatment apparatus may be used as long as it can at least heat a treatment atmosphere and maintain a temperature of the treatment atmosphere.

In this embodiment, a semiconductor substrate having a crystalline semiconductor film is manufactured by introducing a glass substrate over which an amorphous semiconductor film is formed into a treatment atmosphere which is maintained at a predetermined temperature. Accordingly, since rapid heating is realized as compared with the case where a temperature is increased in stages, or the like, crystal nuclei are evenly generated on an entire surface of the semiconductor film, and thus variation in the size of crystal grains can be reduced. In addition, the crystalline semiconductor film can be formed without using a catalytic element; therefore, an increase of the number of steps can be suppressed. Further, since time required for the process can be shortened as compared with the case of performing heating in stages, productivity of the semiconductor substrate can be increased.

This embodiment can be implemented in combination with any of the other embodiments or example as appropriate.

Embodiment 2

In this embodiment, another example of a method for manufacturing a semiconductor substrate used for a semiconductor device will be described. Note that there are many common points between the method for manufacturing a semiconductor substrate in this embodiment and the method for manufacturing a semiconductor substrate, according to Embodiment 1. Therefore, in this embodiment, only points that are different from Embodiment 1 will be described and descriptions for the others will be omitted.

First, a semiconductor film is formed over a glass substrate, according to the method described in Embodiment 1 or the like. Embodiment 1 can be referred to for details of the glass substrate and the semiconductor film.

Next, the above glass substrate over which the semiconductor film is formed is introduced into a treatment atmosphere in which a temperature is set at higher than or equal to a strain point of the glass substrate. Thus, crystallization of the semiconductor film proceeds. Here, a temperature higher than or equal to the strain point of the glass substrate is preferably a temperature lower than or equal to the strain point of the glass substrate+50° C.

In this embodiment, the treatment atmosphere is set at the temperature higher than or equal to the strain point of the glass substrate when the glass substrate is first introduced thereinto. However, since the temperature of the atmosphere is decreased by the introduction of the glass substrate, the temperature is over the strain point only for an extremely short time actually. The semiconductor film can be heated rapidly by thus being put in an atmosphere whose temperature is temporarily over the strain point. Accordingly, variation in the size of crystal grains can be further reduced.

Note that it is necessary to hold the glass substrate at a temperature lower than or equal to the strain point of the glass substrate in a manner similar to that of Embodiment 1. The holding time may be set to be approximately 1 minute to 10 minutes, preferably 3 minutes to 10 minutes in a manner similar to that of Embodiment 1. Embodiment 1 may be referred to also for other conditions.

This embodiment can be implemented in combination with any of the other embodiments or example as appropriate.

Embodiment 3

In this embodiment, a method for manufacturing a semiconductor device using the above-described semiconductor substrate will be described with reference to FIGS. 4A to 4D, FIGS. 5A to 5D, and FIGS. 6A and 6B. Here, a method for manufacturing a semiconductor device including a plurality of transistors will be described as an example of the semiconductor device. Note that various semiconductor devices can be formed with the use of transistors described below in combination.

Figure 4A:
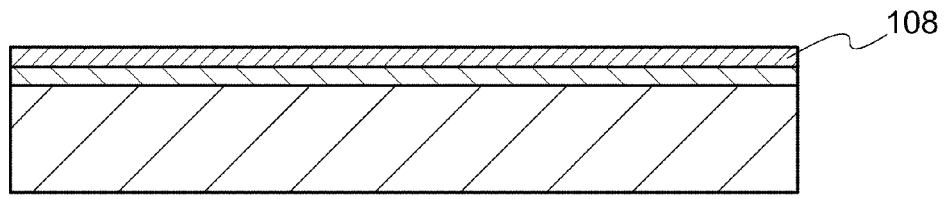
FIGS. 4A to 4D are views illustrating an example of a method for manufacturing a semiconductor device.
Figure 4B:
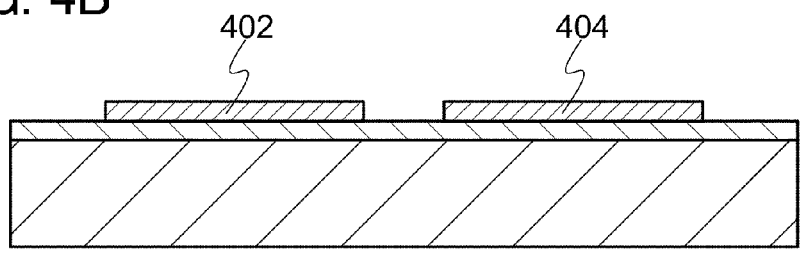

FIG. 4A is a cross-sectional view of a semiconductor substrate manufactured in accordance with Embodiment 1 (or Embodiment 2).

In order to control a threshold voltage of a TFT, a p-type impurity such as boron, aluminum, or gallium or an n-type impurity such as phosphorus or arsenic may be added to the crystalline semiconductor film 108. A region where an impurity is added and a kind of the impurity to be added can be changed as appropriate. For example, a p-type impurity is added to a formation region of an n-channel TFT, and an n-type impurity is added to a formation region of a p-channel TFT. The above-described impurity may be added at a dose of approximately $1 \times 10^{15}/cm^2$ to $1 \times 10^{17}/cm^2$. After that, the crystalline semiconductor film 108 is separated into island-like shapes, whereby a semiconductor film 402 and a semiconductor film 404 are formed (see FIG. 4B).

Figure 4C:
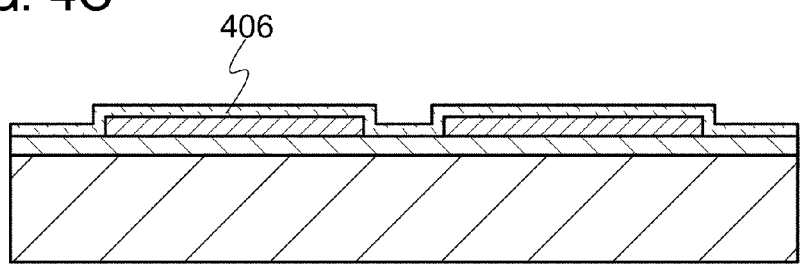

Next, a gate insulating film 406 is formed so as to cover the semiconductor film 402 and the semiconductor film 404 (see FIG. 4C). Here, a single layer of a silicon oxide film is formed by a plasma CVD method. Alternatively, a film containing silicon oxynitride, silicon nitride oxide, silicon nitride, hafnium oxide, aluminum oxide, tantalum oxide, or the like may be formed with a single-layer structure or a layered structure as the gate insulating film 406.

As a manufacturing method other than a plasma CVD method, a sputtering method and an oxidation or nitridation method using high-density plasma treatment can be given. High-density plasma treatment is performed using, for example, a mixed gas of a rare gas such as helium, argon, krypton, or xenon, and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor films are oxidized or nitrided by oxygen radicals (OH radicals may be included) or nitrogen radicals (NH radicals may be included) which are generated by such high-density plasma, whereby the insulating film is formed to a thickness of greater than or equal to 1 nm and less than or equal to 20 nm, desirably greater than or equal to 2 nm and less than or equal to 10 nm so as to be in contact with the semiconductor films.

Since the oxidation or nitridation of the semiconductor films by the above-described high-density plasma treatment progresses under a solid-phase reaction, interface state density of interfaces between the gate insulating film 406 and each of the semiconductor films 402 and 404 can be drastically decreased. Further, the semiconductor films are directly oxidized or nitrided by the high-density plasma treatment, whereby variation in thickness of the insulating film to be formed can be suppressed. In addition, since the semiconductor films have crystallinity, even when surfaces of the semiconductor films are oxidized by a solid-phase reaction by the high-density plasma treatment, inhomogeneous oxidation in crystal grain boundaries can be suppressed; thus, a gate insulating film with favorable homogeneity and low interface state density can be formed. Thus, when an insulating film formed by high-density plasma treatment is used for part of or the entire gate insulating film of a transistor, variation in characteristics of transistors can be suppressed.

Alternatively, the gate insulating film 406 may be formed by thermally oxidizing the semiconductor film 402 and the semiconductor film 404. In the case of using thermal oxidation in this manner, it is necessary to use a glass substrate having a certain degree of heat resistance.

Note that, alternatively, after the gate insulating film 406 containing hydrogen is formed, hydrogen contained in the gate insulating film 406 may be diffused in the semiconductor film 402 and the semiconductor film 404 by performing heat treatment at a temperature higher than or equal to 350° C. and lower than or equal to 450° C. In this case, the gate insulating film 406 can be formed using silicon nitride or silicon nitride oxide by a plasma CVD method. Note that a process temperature is preferably set to lower than or equal to 350° C. In this manner, hydrogen is supplied to the semiconductor film 402 and the semiconductor film 404, whereby defects in the semiconductor film 402 and the semiconductor film 404, at an interface between the gate insulating film 406 and the semiconductor film 402, and at an interface between the gate insulating film 406 and the semiconductor film 404 can be effectively reduced.

Figure 4D:
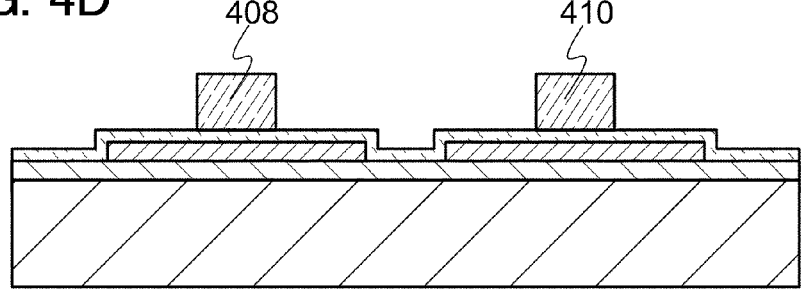

Next, a conductive film is formed over the gate insulating film 406, and then the conductive film is processed (patterned) to have a predetermined shape, whereby an electrode 408 and an electrode 410 are formed above the semiconductor film 402 and the semiconductor film 404, respectively (see FIG. 4D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above metal as its main component or a compound containing the above metal may be used. Further alternatively, a semiconductor material such as polycrystalline silicon obtained by doping a semiconductor with an impurity element imparting one conductivity type may be used.

Although the electrode 408 and the electrode 410 are each formed of a single-layer conductive film in this embodiment, the semiconductor device of the invention to be disclosed is not limited to the structure. The electrode 408 and the electrode 410 may be formed by stacking a plurality of conductive films. In the case of a two-layer structure, for example, a molybdenum film, a titanium film, a titanium nitride film, or the like may be used for a lower layer, and an aluminum film or the like may be used for an upper layer. In the case of a three-layer structure, a layered structure of a molybdenum film, an aluminum film, and a molybdenum film; a layered structure of a titanium film, an aluminum film, and a titanium film; or the like may be employed.

Note that a mask used for forming the electrode 408 and the electrode 410 may be formed using a material such as silicon oxide or silicon nitride oxide. In this case, a step of forming a mask by patterning a silicon oxide film, a silicon nitride oxide film, or the like is additionally needed; however, the amount of the reduced film thickness of the mask in etching is small as compared with the case of using a resist material. Thus, the electrode 408 and the electrode 410 with accurate shapes can be formed. Alternatively, the electrode 408 and the electrode 410 may be selectively formed by a droplet discharge method without using masks. Here, a droplet discharge method refers to a method in which droplets containing a predetermined composition are discharged or ejected to form a predetermined pattern, and includes an ink jet method and the like in its category.

Alternatively, the electrode 408 and the electrode 410 may be formed by etching the conductive film to have a desired tapered shape by an inductively coupled plasma (ICP) etching method with appropriate control of the etching conditions (for example, the amount of electric power applied to a coiled electrode, the amount of electric power applied to an electrode on the substrate side, and the temperature of the electrode on the substrate side). In addition, the tapered shape can be controlled by the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 5A:
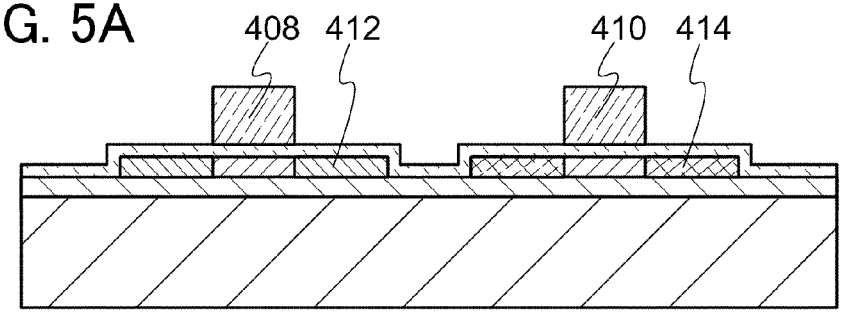
FIGS. 5A to 5D are views illustrating an example of a method for manufacturing a semiconductor device.

Next, an impurity element imparting one conductivity type is added to the semiconductor film 402 and the semiconductor film 404 by using the electrode 408 and the electrode 410 as masks (see FIG. 5A). In this embodiment, an impurity element imparting n-type conductivity (for example, phosphorus or arsenic) is added to the semiconductor film 402, and an impurity element imparting p-type conductivity (for example, boron) is added to the semiconductor film 404. Note that when the impurity element imparting n-type conductivity is added to the semiconductor film 402, the semiconductor film 404 to which the impurity element imparting p-type conductivity is added is covered with a mask or the like so that the impurity element imparting n-type conductivity is added selectively. Further, when the impurity element imparting p-type conductivity is added to the semiconductor film 404, the semiconductor film 402 to which the impurity element imparting n-type conductivity is added is covered with a mask or the like so that the impurity element imparting p-type conductivity is added selectively. Alternatively, after one of an impurity element imparting p-type conductivity or an impurity element imparting n-type conductivity is added to the semiconductor film 402 and the semiconductor film 404, the other may be added only to one of the semiconductor films at higher concentration. By the addition of the impurity element, impurity regions 412 and 414 are formed in the semiconductor films 402 and 404, respectively.

Figure 5B:
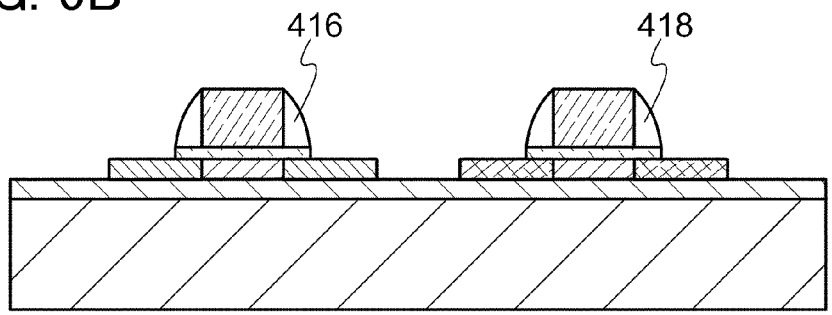

Next, sidewalls 416 are formed on side surfaces of the electrode 408, and sidewalls 418 are formed on side surfaces of the electrode 410 (see FIG. 5B). For example, the sidewalls 416 and the sidewalls 418 can be formed by newly forming an insulating film so as to cover the gate insulating film 406, the electrode 408, and the electrode 410 and by partially etching the insulating film by anisotropic etching mainly in a perpendicular direction. Note that the gate insulating film 406 may be etched partially by the above anisotropic etching. As the insulating film for forming the sidewalls 416 and the sidewalls 418, a film containing silicon, silicon oxide, silicon nitride, silicon oxynitride, silicon nitride oxide, an organic material, or the like may be formed to have a single-layer structure or a layered structure by a plasma CVD method, a sputtering method, or the like. In this embodiment, a 100-nm-thick silicon oxide film is formed by a plasma CVD method. Further, as an etching gas, a mixed gas of $CHF_3$ and helium can be used. Note that the steps of forming the sidewalls 416 and the sidewalls 418 are not limited thereto.

Figure 5C:
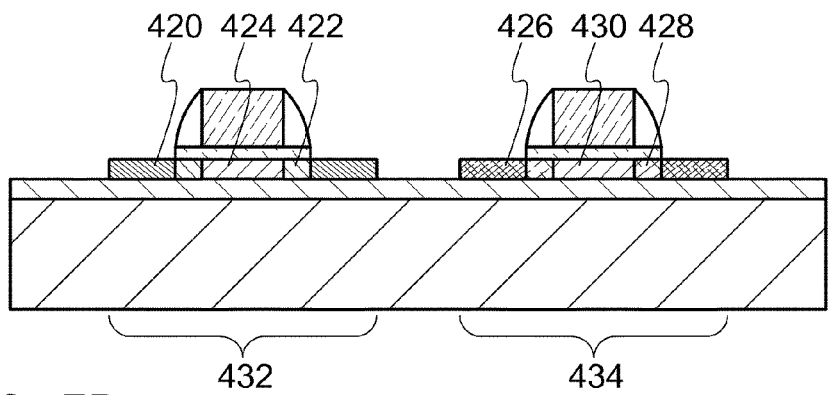

Next, an impurity element imparting one conductivity type is added to each of the semiconductor films 402 and 404 using the gate insulating film 406, the electrodes 408 and 410, the sidewalls 416 and 418 as masks (see FIG. 5C). Note that impurity elements imparting the same conductivity types as the impurity elements which have been added to the semiconductor films 402 and 404 in the previous step are added to the semiconductor film 402 and the semiconductor film 404 at a higher concentration. Here, when the impurity element imparting n-type conductivity is added to the semiconductor film 402, the semiconductor film 404 to which the impurity element imparting p-type conductivity is added is covered with a mask or the like so that the impurity element imparting n-type conductivity is added selectively. Further, when the impurity element imparting p-type conductivity is added to the semiconductor film 404, the semiconductor film 402 to which the impurity element imparting n-type conductivity is added is covered with a mask or the like so that the impurity element imparting p-type conductivity is added selectively.

By the addition of the impurity element, a pair of high concentration impurity regions 420, a pair of low concentration impurity regions 422, and a channel formation region 424 are formed in the semiconductor film 402. Further, by the addition of the impurity element, a pair of high concentration impurity regions 426, a pair of low concentration impurity regions 428, and a channel formation region 430 are formed in the semiconductor film 404. The high concentration impurity regions 420 and the high concentration impurity regions 426 serve as sources or drains, and the low concentration impurity regions 422 and 428 serve as LDD (lightly doped drain) regions.

Note that the sidewalls 416 formed over the semiconductor film 402 and the sidewalls 418 formed over the semiconductor film 404 may be formed so as to have the same length in a direction where carriers move (a direction parallel to a so-called channel length), or may be formed so as to have different lengths. The sidewalls 418 over the semiconductor film 404 which constitutes part of a p-channel transistor may be formed to be larger than the sidewalls 416 over the semiconductor film 402 which constitutes part of an n-channel transistor. This is because boron which is added for forming a source and a drain in the p-channel transistor is easily diffused and a short channel effect is easily induced. By increasing the length of the sidewalls 418 of the p-channel transistor, boron can be added to the source and the drain at high concentration, whereby resistance of the source and the drain can be reduced.

A silicide layer in which silicide is formed in part of the semiconductor films 402 and 404 may be formed in order to further reduce the resistance of the source and the drain. The silicide is formed by placing metal in contact with the semiconductor films and causing a reaction between the metal and silicon in the semiconductor films by heat treatment (for example, a GRTA method or an LRTA method). For the silicide layer, cobalt silicide or nickel silicide may be used. In the case where the semiconductor film 402 and the semiconductor film 404 are thin, silicide reaction may proceed to the bottom portions of the semiconductor films 402 and 404. As a metal material which can be used for forming silicide, titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like can be given. Alternatively, a silicide layer may be formed by laser beam irradiation or the like.

Through the above-described steps, an n-channel transistor 432 and a p-channel transistor 434 are formed. Note that although conductive films each serving as a source electrode or a drain electrode are not formed in the stage illustrated in FIG. 5C, a structure including these conductive films each serving as a source electrode and a drain electrode may be referred to as a transistor.

Figure 5D:
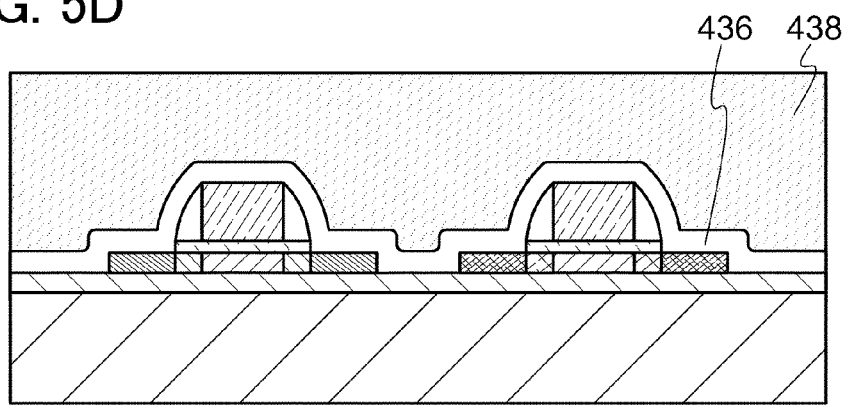

Next, an insulating film 436 is formed so as to cover the n-channel transistor 432 and the p-channel transistor 434 (see FIG. 5D). The insulating film 436 is not necessarily provided; however, formation of the insulating film 436 can prevent impurities such as alkali metal or alkaline earth metal from entering the n-channel transistor 432 and the p-channel transistor 434. Specifically, the insulating film 436 is desirably formed using a material such as silicon oxide, silicon nitride, silicon oxynitride, silicon nitride oxide, aluminum nitride, or aluminum oxide. In this embodiment, a silicon nitride oxide film with a film thickness of approximately 600 nm is used as the insulating film 436. In this case, the above-described hydrogenation process may be performed after the silicon nitride oxide film is formed. Note that although the insulating film 436 has a single-layer structure in this embodiment, it is needless to say that the insulating film 436 may have a layered structure. For example, in the case of a two-layer structure, the insulating film 436 may have a layered structure of a silicon oxynitride film and a silicon nitride oxide film.

Next, an insulating film 438 is formed over the insulating film 436 so as to cover the n-channel transistor 432 and the p-channel transistor 434. The insulating film 438 may be formed using an organic material having heat resistance, such as polyimide, acrylic, benzocyclobutene, polyamide, or epoxy. As an alternative to the above organic materials, a low-dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like may be used. Here, the siloxane-based resin corresponds to a resin including a Si—O—Si bond which is formed using a siloxane-based material as a starting material. The siloxane-based resin may include one selected from fluorine, an alkyl group, or aromatic hydrocarbon besides hydrogen as a substituent. Note that the insulating film 438 may be formed by stacking a plurality of insulating films formed using any of the above materials.

The insulating film 438 can be formed by the following method depending on a material of the insulating film 438: a CVD method, a sputtering method, an SOG method, spin coating, dipping, spray coating, a droplet discharge method (an ink jet method, screen printing, offset printing, or the like), a doctor knife, a roll coater, a curtain coater, a knife coater, or the like.

Next, contact holes are formed in the insulating film 436 and the insulating film 438 so that the semiconductor film 402 and the semiconductor film 404 are partially exposed. Then, a conductive film 440 and a conductive film 442 which are in contact with the semiconductor film 402, and a conductive film 444 and a conductive film 446 which are in contact with the semiconductor film 404 through the contact holes are formed (see FIG. 6A). The conductive films 440 to 446 each serve as a source or drain electrode of the transistors. Note that a mixed gas of $CHF_3$ and He is used as an etching gas for forming the contact holes in this embodiment; however, the etching gas is not limited thereto.

The conductive films 440 to 446 can be formed by a CVD method, a sputtering method, or the like. Specifically, as the conductive films 440 to 446, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing any of the above materials as its main component or a compound containing any of the above materials may be used. Further, the conductive films 440 to 446 may each have a single-layer structure or a layered structure.

As an example of an alloy containing aluminum as its main component, an alloy containing aluminum as its main component and also containing nickel can be given. In addition, an alloy containing aluminum as its main component and also containing nickel and one or both of carbon and silicon can also be given. Since aluminum and aluminum silicon (Al—Si) have low resistance and are inexpensive, they are suitable for a material for forming the conductive films 440 to 446. In particular, aluminum silicon is preferable because aluminum silicon can suppress generation of a hillock due to resist baking at the time of patterning. Further, a material in which approximately 0.5% of Cu is mixed into aluminum may be used instead of silicon.

In the case where each of the conductive films 440 to 446 is formed to have a layered structure, for example, a layered structure of a barrier film, an aluminum silicon film, and a barrier film; a layered structure of a barrier film, an aluminum silicon film, a titanium nitride film, and a barrier film; or the like may be employed. Note that the barrier film refers to a film formed using titanium, a nitride of titanium, molybdenum, a nitride of molybdenum, or the like. By forming the conductive film so that an aluminum silicon film is interposed between the barrier films, generation of a hillock of aluminum or aluminum silicon can be further prevented. Further, by forming the barrier film using titanium, which is a highly reducible element, even if a thin oxide film is formed over the semiconductor film 402 and the semiconductor film 404, the oxide film is reduced by titanium contained in the barrier film, whereby favorable contact between the conductive films 440 and 442 and the semiconductor film 402 and between the conductive films 444 and 446 and the semiconductor film 404 can be obtained. Further, a plurality of barrier films may be stacked. In that case, for example, each of the conductive films 440 to 446 may be formed to have a five-layer structure including, titanium, titanium nitride, aluminum silicon, titanium, and titanium nitride in this order from the bottom or a layered structure including more than five layers.

Alternatively, as the conductive films 440 to 446, tungsten silicide formed by a chemical vapor deposition method using a $WF_6$ gas and a $SiH_4$ gas may be used. Alternatively, tungsten formed by hydrogen reduction of $WF_6$ may be used as the conductive films 440 to 446.

Note that the conductive film 440 and the conductive film 442 are connected to the high concentration impurity region 420 of the n-channel transistor 432. The conductive film 444 and the conductive film 446 are connected to the high concentration impurity region 426 of the p-channel transistor 434.

Figure 6A:
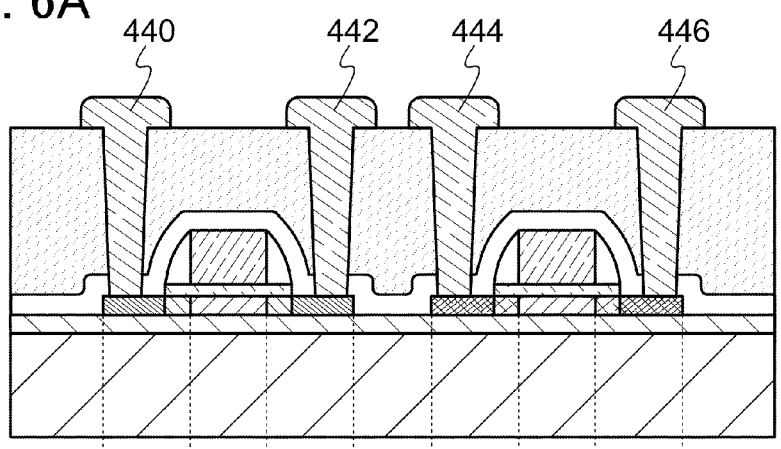
FIGS. 6A and 6B are views illustrating an example of a semiconductor device.
Figure 6B:
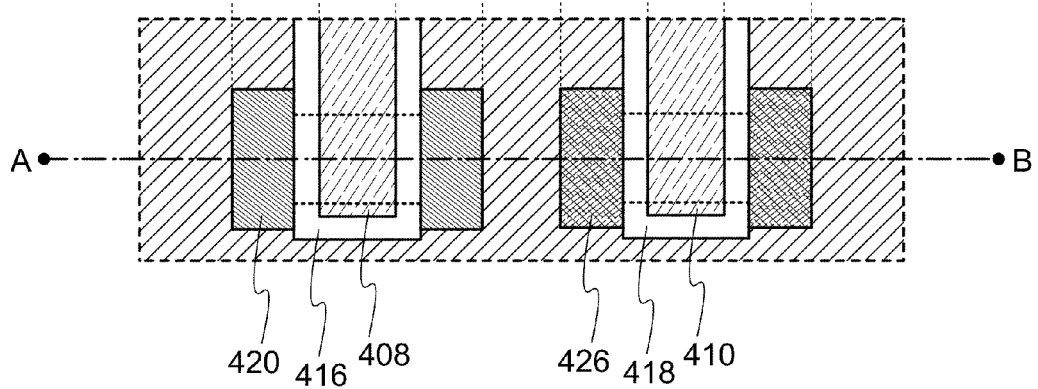

FIG. 6B illustrates a plan view of the n-channel transistor 432 and the p-channel transistor 434 which are illustrated in FIG. 6A. Here, the cross section in FIG. 6A is taken along line A-B in FIG. 6B. Note that in FIG. 6B, the conductive films 440 to 446, the insulating film 436, the insulating film 438, and the like are omitted for simplicity.

Note that although the case where the n-channel transistor 432 and the p-channel transistor 434 each include one electrode serving as a gate electrode (include the electrode 408 and the electrode 410, respectively) is described as an example in this embodiment, the invention is not limited to this structure. The transistor to be manufactured may have a multi-gate structure in which a plurality of electrodes serving as gate electrodes are included and electrically connected to one another.

In this embodiment, the transistor is formed using a crystalline semiconductor film. Accordingly, switching speed of the transistor is increased as compared with the case where an amorphous semiconductor film or the like is used. Furthermore, since a homogeneous and favorable crystalline semiconductor film is used in this embodiment, variation in characteristics of transistors can be sufficiently suppressed. Thus, a semiconductor device having excellent characteristics can be provided.

This embodiment can be implemented in combination with any of the other embodiments or example as appropriate.

Embodiment 4

In this embodiment, an example of a method for manufacturing a semiconductor device will be described with reference to FIGS. 7A to 7D, FIGS. 8A to 8C, FIGS. 9A to 9C, and FIGS. 10A and 10B. Note that in this embodiment, a liquid crystal display device will be described as an example of the semiconductor device; however, the semiconductor device is not limited to the liquid crystal display device. Further, a case of manufacturing a liquid crystal display device using a top gate type thin film transistor will be described in this embodiment; however, the invention to be disclosed is not limited thereto.

First, a crystalline semiconductor film is formed over a glass substrate using the method described in Embodiment 1. Specifically, a crystalline semiconductor film 704 is formed over a glass substrate 700 with an insulating film 702 interposed therebetween (see FIG. 7A).

Embodiment 1 can be referred to for details of the glass substrate 700, the insulating film 702, and the crystalline semiconductor film 704; therefore, the description thereof is omitted here.

Next, the crystalline semiconductor film 704 is patterned into a desired shape so as to form an island-like semiconductor film 706, an island-like semiconductor film 708, and an island-like semiconductor film 710.

Note that as an etching process in patterning, either plasma etching (dry etching) or wet etching can be used. For treating a large-sized substrate, plasma etching is suitable. As an etching gas, a fluorine-based or chlorine-based gas such as $CF_4$, $NF_3$, $Cl_2$, or $BCl_3$ is used, and an inert gas such as He or Ar may be appropriately added thereto. When the etching is performed by an atmospheric pressure discharge, electric discharge can be performed locally, and therefore, a mask layer does not need to be formed over an entire surface of a substrate.

After patterning the crystalline semiconductor film 704, a p-type impurity such as boron, aluminum, or gallium may be added thereto in order to control the threshold voltage. For example, as the p-type impurity, boron can be added at a concentration of $5 \times 10^{17}$ atoms/cm$^3$ to $1 \times 10^{18}$ atoms/cm$^3$. Needless to say, the above impurity element may be added before patterning the crystalline semiconductor film 704.

Next, a gate insulating film 712 is formed so as to cover the island-like semiconductor films (see FIG. 7B). The gate insulating film 712 is formed of an insulating film containing silicon to a thickness of approximately 10 nm to 150 nm by a CVD method, a sputtering method, or the like. Specifically, the gate insulating film 712 may be formed using a material such as an oxide material or nitride material of silicon typified by silicon nitride, silicon oxide, silicon oxynitride, and silicon nitride oxide. Note that the gate insulating film 712 may have a single-layer structure or a layered structure. Furthermore, a thin silicon oxide film with a thickness of greater than or equal to 1 nm and less than or equal to 100 nm, preferably greater than or equal to 1 nm and less than or equal to 10 nm, or more preferably greater than or equal to 2 nm and less than or equal to 5 nm may be formed between the island-like semiconductor films and the gate insulating film. Note that in order to form a gate insulating film having less gate leakage current at a low temperature, a rare gas element such as argon may be contained in a reaction gas.

Next, a first conductive film and a second conductive film, which are used as gate electrode layers or the like, are stacked over the gate insulating film 712. The first conductive film may be formed to a thickness of approximately 20 nm to 100 nm, and the second conductive film may be formed with a thickness of approximately 100 nm to 400 nm. In addition, the first conductive film and the second conductive film can be formed by a sputtering method, an evaporation method, a CVD method, or the like. The first conductive film and the second conductive film may be formed using an element selected from tantalum (Ta), tungsten (W), titanium (Ti), molybdenum (Mo), aluminum (Al), copper (Cu), chromium (Cr), or neodymium (Nd), an alloy or compound material containing the above element as its main component, or the like. Further, as the first conductive film and the second conductive film, a semiconductor film doped with an impurity element such as phosphorus; an AgPdCu alloy; or the like may be used. Note that this embodiment is described using a two-layer structure; however, the invention to be disclosed is not limited thereto. A layered structure of three or more layers or a single-layer structure may be employed.

Next, a mask 716a, a mask 716b, a mask 716c, a mask 716d, and a mask 716e each of which is formed using a resist material are formed by a photolithography method. Then, the first conductive film and the second conductive film are processed to have desired shapes by using the above masks, thereby forming a first gate electrode layer 718a, a first gate electrode layer 718b, a first gate electrode layer 718c, a first gate electrode layer 718d, a first conductive layer 718e, a conductive layer 720a, a conductive layer 720b, a conductive layer 720c, a conductive layer 720d, and a conductive layer 720e (see FIG. 7C).

Here, etching can be performed to form a desired tapered shape by an ICP (inductively coupled plasma) etching method with appropriate control of the etching conditions (for example, the amount of electric power applied to a coiled electrode layer, the amount of electric energy applied to an electrode layer on the substrate side, and the temperature of the electrode on the substrate side). An angle and the like of the tapered shape may be controlled by the shape of the masks. Note that as an etching gas, the following can be used as appropriate: a chlorine-based gas typified by $Cl_2$, $BCl_3$, $SiCl_4$, $CCl_4$, and the like; a fluorine-based gas typified by $CF_4$, $SF_6$, $NF_3$, and the like; $O_2$; or the like. In this embodiment, etching of the second conductive film by using an etching gas containing $CF_4$, $Cl_2$, and $O_2$ and etching of the first conductive film by using an etching gas containing $CF_4$ and $Cl_2$ are successively performed.

Next, the conductive layers 720a, 720b, 720c, 720d and 720e are processed to have desired shapes, using the masks 716a, 716b, 716c, 716d, and 716e. At this time, etching is performed under the etching condition in which the selectivity of the second conductive film, which forms the above conductive layers, to the first conductive film, which forms the first gate electrode layers and the first conductive layer, is high. By this etching, second gate electrode layers 722a, 722b, 722c, and 722d, and a second conductive layer 722e are formed. In this embodiment, the second gate electrode layers and the second conductive layer have tapered shapes, and each of the taper angles is larger than the taper angle of each of the first gate electrode layers 718a, 718b, 718c, and 718d and the first conductive layer 718e. Note that a "taper angle" refers to an angle formed by a bottom surface and a side surface of an object. Thus, when the taper angle is 90°, the conductive layer has a perpendicular side surface to the bottom surface of the conductive layer. By setting the taper angle to smaller than 90°, coverage of a film to be stacked thereover is improved and thus a defect can be reduced. Note that $Cl_2$, $SF_6$, and $O_2$ are used as an etching gas for forming the second gate electrode layers and the second conductive layer in this embodiment.

Through the above steps, a gate electrode layer 724a and a gate electrode layer 724b can be formed in a peripheral driver circuit region 780, and a gate electrode layer 724c, a gate electrode layer 724d, and a conductive layer 724e can be formed in a pixel region 790 (see FIG. 7D). Note that the mask 716a, the mask 716b, the mask 716c, the mask 716d, and the mask 716e are removed after the above steps.

Next, an impurity element imparting n-type conductivity is added using the gate electrode layer 724a, the gate electrode layer 724b, the gate electrode layer 724c, and the gate electrode layer 724d as masks to form a first n-type impurity region 726a, a first n-type impurity region 726b, a first n-type impurity region 728a, a first n-type impurity region 728b, a first n-type impurity region 730a, a first n-type impurity region 730b, and a first n-type impurity region 730c (see FIG. 8A). In this embodiment, doping is performed by using phosphine ($PH_3$) as a doping gas containing an impurity element. Further, phosphorus (P) that is an impurity element imparting n-type conductivity is added to the first n-type impurity regions at a concentration of approximately $1\times10^{17}$ atoms/$cm^3$ to $5\times10^{18}$ atoms/$cm^3$.

Next, a mask 732a, a mask 732b, and a mask 732c are formed to cover the semiconductor film 706 and part of the semiconductor film 710. Then, an impurity element imparting n-type conductivity is added using the mask 732a, the mask 732b, the mask 732c, and the gate electrode layer 724b as masks. Accordingly, second n-type impurity regions 734a and 734b; third n-type impurity regions 736a and 736b; second n-type impurity regions 740a, 740b, and 740c; and third n-type impurity regions 742a, 742b, 742c, and 742d are formed. In this embodiment, doping is performed using phosphine ($PH_3$) as a doping gas containing an impurity element. Here, phosphorus (P) that is an impurity element imparting n-type conductivity is added to the second n-type impurity regions at a concentration of approximately $5\times10^{19}$ atoms/$cm^3$ to $5\times10^{20}$ atoms/$cm^3$. An impurity element imparting n-type conductivity is added to the third n-type impurity regions 736a and 736b at a concentration approximately the same as or slightly higher than that of the third n-type impurity regions 742a to 742d. In addition, a channel formation region 738, a channel formation region 744a, and a channel formation region 744b are formed by the doping (see FIG. 8B).

The second n-type impurity regions are high-concentration impurity regions and each serve as a source or a drain. On the other hand, the third n-type impurity regions are low-concentration impurity regions, which are as so-called lightly doped drain (LDD) regions. Each of the third n-type impurity regions 736a and 736b is formed in a region overlapping with the first gate electrode layer 718b. Accordingly, an electric field in vicinity of a source or a drain can be relieved and deterioration of on-current due to hot carriers can be prevented. On the other hand, the third n-type impurity regions 742a, 742b, 742c, and 742d are not overlapped with the gate electrode layers 724c and 724d; thus, an effect of reducing off-state current can be obtained.

Next, the mask 732a, the mask 732b, and the mask 732c are removed, and a mask 746a and a mask 746b which cover the semiconductor film 708 and the semiconductor film 710, respectively, are formed. Then, an impurity element imparting p-type conductivity is added using the mask 746a, the mask 746b, and the gate electrode layer 724a as masks. Accordingly, a first p-type impurity region 748a, a first p-type impurity region 748b, a second p-type impurity region 750a, and a second p-type impurity region 750b are formed. In this embodiment, doping is performed using diborane ($B_2H_6$) as a doping gas containing an impurity element. Here, boron (B) which is an impurity element imparting p-type conductivity is added to the first p-type impurity regions and the second p-type impurity regions at a concentration of approximately $1\times10^{20}$ atoms/$cm^3$ to $5\times10^{21}$ atoms/$cm^3$. By the doping, a channel formation region 752 is formed (see FIG. 8C).

The first p-type impurity regions are high-concentration impurity regions and each serve as a source or a drain. On the other hand, the second p-type impurity regions are low-concentration impurity regions, which are so-called lightly doped drain (LDD) regions.

After that, the mask 746a and the mask 746b are removed. After the masks are removed, an insulating film may be formed so as to cover the side surfaces of the gate electrode layers. The insulating film can be formed by a plasma CVD method or a low pressure CVD (LPCVD) method. Further, heat treatment, intense light irradiation, or laser beam irradiation may be performed to activate the impurity elements.

Next, an interlayer insulating film which covers the gate electrode layers and the gate insulating film is formed. In this embodiment, the interlayer insulating film is formed to have a layered structure of insulating films 754 and 756 (see FIG. 9A). The layered structure is formed by forming a silicon nitride oxide film with a thickness of 100 nm as the insulating film 754 and forming a silicon oxynitride film with a thickness of 900 nm as the insulating film 756. In this embodiment, the interlayer insulating film has a layered structure of two layers; however, it may have a single-layer structure or a layered structure including three or more layers. In this embodiment, the insulating film 754 and the insulating film 756 are successively formed by a plasma CVD method. Note that materials for the insulating film 754 and the insulating film 756 are not limited to the above materials.

The insulating film 754 and the insulating film 756 can alternatively be formed using a material selected from silicon oxide, silicon nitride, aluminum oxide, aluminum nitride, aluminum oxynitride, aluminum nitride oxide in which the amount of nitrogen is larger than that of oxygen, diamond-like carbon (DLC), a nitrogen-containing carbon film, or any other substance containing an inorganic insulating material. Alternatively, a siloxane resin may be used. Note that a siloxane resin is a resin including a Si—O—Si bond. Siloxane has a skeleton structure formed by a bond of silicon (Si) and oxygen (O). As a substituent, an organic group (for example, an alkyl group or an aryl group) containing at least hydrogen is used. A fluoro group may be included in the organic group. Alternatively, an organic insulating material such as polyimide, acrylic polymer, polyamide, polyimide amide, benzocyclobutene-based material, or polysilazane may be used.

Next, contact holes (openings) which reach the semiconductor films and the gate electrode layers are formed in the insulating film 754, the insulating film 756, and the gate insulating film 712, using a mask formed using a resist material. Etching may be performed once or a plurality of times depending on a material which is used. In this embodiment, first etching is performed under a condition in which selectivity of the insulating film 756 which is a silicon oxynitride film to the insulating film 754 and the gate insulating film 712 which are silicon nitride oxide films is high, so that the insulating film 756 is removed. Next, the insulating film 754 and the gate insulating film 712 are removed by second etching, and openings each of which reach a source or a drain are formed.

After that, a conductive film is formed so as to cover the openings, and the conductive film is etched. Accordingly, a source or drain electrode layer 758a, a source or drain electrode layer 758b, a source or drain electrode layer 760a, a source or drain electrode layer 760b, a source or drain electrode layer 762a, and a source or drain electrode layer 762b, each of which are electrically connected to part of a source or drain region are formed. The source electrode layers and the drain electrode layers are formed using one or a plurality of elements selected from aluminum, tantalum, titanium, molybdenum, tungsten, neodymium, chromium, nickel, platinum, gold, silver, copper, magnesium, scandium, cobalt, zinc, niobium, silicon, phosphorus, boron, arsenic, gallium, indium, and tin; a compound or an alloy material containing any of the above elements as its component (for example, indium tin oxide (ITO), indium zinc oxide (IZO), indium tin oxide containing silicon oxide (ITSO), zinc oxide, aluminum-neodymium (Al—Nd), or magnesium-silver (Mg—Ag)); a substance that is a combination of any of these compounds; or the like. Alternatively, a silicide (for example, aluminum silicon, molybdenum silicon, or nickel silicide), a nitrogen-containing compound (for example, titanium nitride, tantalum nitride, or molybdenum nitride), silicon (Si) that is doped with an impurity element such as phosphorus (P), or the like may be used.

Through the above steps, a p-channel thin film transistor 764 and an n-channel thin film transistor 766 are formed in the peripheral driver circuit region 780, and an n-channel thin film transistor 768 and a capacitor wiring 770 are formed in the pixel region 790 (see FIG. 9B).

Next, an insulating film 772 is formed as a second interlayer insulating film. The insulating film 772 can be formed using a material selected from silicon oxide, silicon nitride, silicon oxynitride, silicon nitride oxide, aluminum oxide, aluminum nitride, aluminum oxynitride, aluminum nitride oxide in which the amount of nitrogen is larger than that of oxygen, diamond-like carbon (DLC), a nitrogen-containing carbon film, phosphosilicate glass (PSG), borophosphosilicate glass (BPSG), an alumina film, polysilazane, or any other substance containing an inorganic insulating material. Alternatively, a siloxane resin may be used. An organic insulating material such as polyimide, acrylic polymer, polyamide, polyimide amide, or benzocyclobutene-based material may be used.

In this embodiment, since the interlayer insulating film provided for planarization needs to have high heat resistance, an excellent insulating property, and a high level of planarity, the interlayer insulating film is preferably formed by a coating method typified by a spin coating method.

Next, a contact hole is formed in the insulating film 772 of the pixel region 790 to form a pixel electrode layer 774 (see FIG. 9C). The pixel electrode layer 774 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, a metal such as tungsten, molybdenum, zirconium, hafnium, vanadium, niobium, tantalum, chromium, cobalt, nickel, titanium, platinum, aluminum, copper, or silver, an alloy thereof, metal nitride thereof, or the like.

Alternatively, a conductive composition containing a conductive macromolecule (also referred to as a conductive polymer) may be used for the pixel electrode layer 774. A thin film of a conductive composition preferably has a sheet resistance of lower than or equal to $10^4 \Omega$/square. Further, in the case where a thin film is formed as a pixel electrode layer having a light-transmitting property, light transmittance is preferably greater than or equal to 70% at a wavelength of 550 nm. In addition, the resistivity of a conductive high molecule which is included in the thin film is preferably equal to or lower than 0.1 Ω·cm.

Figure 10A:
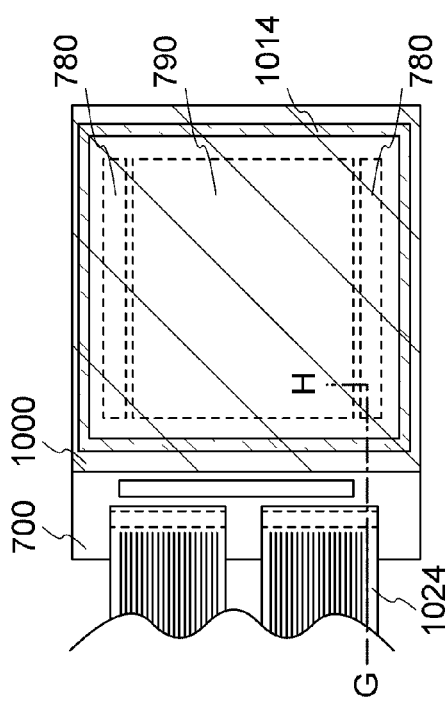
FIGS. 10A and 10B are views illustrating an example of a semiconductor device.
Figure 10B:
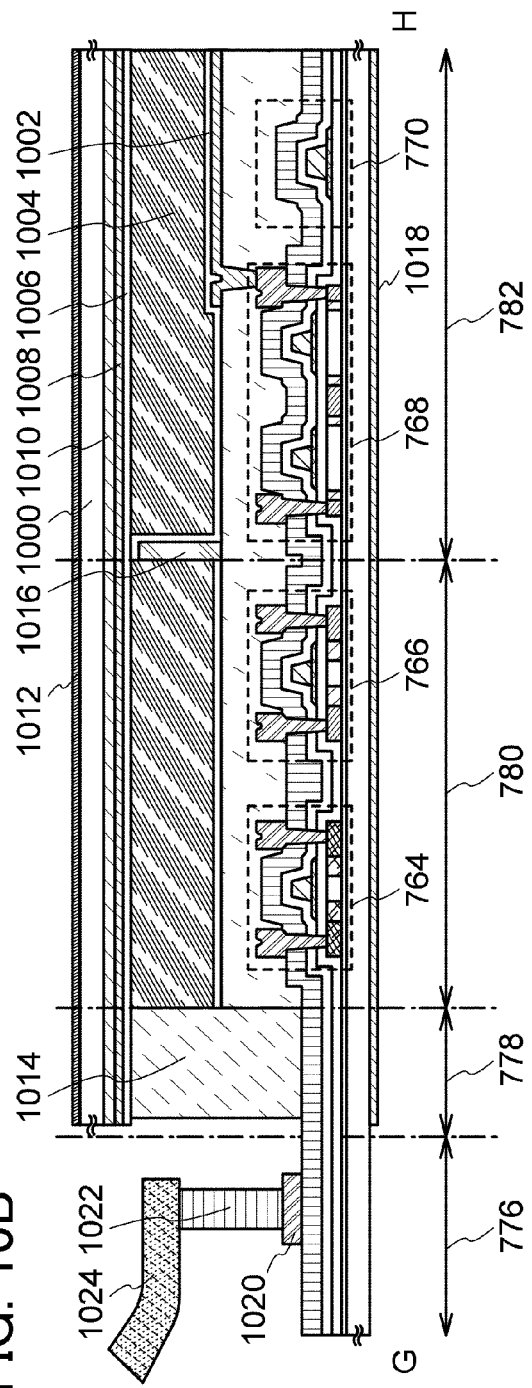

Next, an insulating film 1002 which is referred to as an alignment film is formed so as to cover the pixel electrode layer 774 and the insulating film 772 (see FIG. 10B). The insulating film 1002 can be formed by a screen printing method or an offset printing method. Note that FIGS. 10A and 10B illustrate a plan view and a cross-sectional view of a semiconductor device, respectively; FIG. 10A is a plan view of a semiconductor device and FIG. 10B is a cross-sectional view taken along line G-H of FIG. 10A. In the semiconductor device, an external terminal connection region 776, a sealing region 778, the peripheral driver circuit region 780, and the pixel region 790 are provided.

After the insulating film 1002 is formed, rubbing treatment is performed. An insulating film 1006 which serves as an alignment film on the side of a counter substrate 1000 can also be formed in a manner similar to that of the insulating film 1002.

After that, the counter substrate 1000 and the glass substrate 700 are attached to each other, with a sealant 1014 and a spacer 1016 interposed therebetween, and the space is provided with a liquid crystal layer 1004. Note that the counter substrate 1000 is provided with an insulating film 1006 which serves as an alignment film, a conductive layer 1008 which serves as a counter electrode, a coloring layer 1010 which serves as a color filter, a polarizer 1012 (also referred to as a polarizing plate), and the like. Note that the glass substrate 700 is also provided with a polarizer 1018; however, the invention to be disclosed is not limited thereto. For example, in a reflective liquid crystal display device, a polarizer may be provided for either a counter substrate or a substrate.

Next, an FPC 1024 is connected to a terminal electrode layer 1020 which is electrically connected to the pixel region, through an anisotropic conductive layer 1022. The FPC 1024 has a function of transmitting a signal from the external. The liquid crystal display device can be manufactured through the above steps.

In this embodiment, the transistors in the peripheral driver circuit region and the transistor in the pixel region are manufactured using the crystalline semiconductor film. By use of the crystalline semiconductor film in this manner, a peripheral driver circuit can have required characteristics; thus the peripheral driver circuit can also be formed over the glass substrate. Accordingly, reduction of the number of component parts, reduction of manufacturing cost, and improvement of reliability can be realized. Further, as compared with the case where a transistor in a pixel region is manufactured using an amorphous semiconductor or the like, switching speed of the transistor of the invention to be disclosed is improved; therefore, reaction speed of the liquid crystal display device is improved. In addition, since the transistor in the pixel region can be downsized, an aperture ratio can be increased. Furthermore, since the crystalline semiconductor film used in this embodiment is homogeneous and favorable, variation in characteristics among the transistors can be sufficiently suppressed. That is, variation in characteristics among the transistors in the pixel region can be suppressed; therefore, a liquid crystal display device having favorable image quality can be provided.

Note that the peripheral driver circuits are formed over the glass substrate in this embodiment; however, the invention to be disclosed is not is not interpreted as being limited thereto. Even in the case where only the transistor in the pixel region is formed using the crystalline semiconductor film, a highly excellent liquid crystal display device can be manufactured.

Further, a method for manufacturing a liquid crystal display device is described in this embodiment; however, the invention to be disclosed is not interpreted as being limited thereto. This embodiment can be implemented in combination with any of the other embodiments or example as appropriate.

Embodiment 5

In this embodiment, a semiconductor device (an electroluminescent display device) having a light-emitting element is described as an example of semiconductor devices. Embodiment 4 or the like can be referred to for the detail of the method for manufacturing a thin film transistor; therefore, description thereof is omitted here.

Note that in a semiconductor device having a light-emitting element, any manner of bottom emission, top emission, or dual emission is used. In this embodiment, a semiconductor device employing bottom emission is described with reference to FIGS. 11A and 11B; however, the invention to be disclosed is not limited thereto.

Figure 11A:
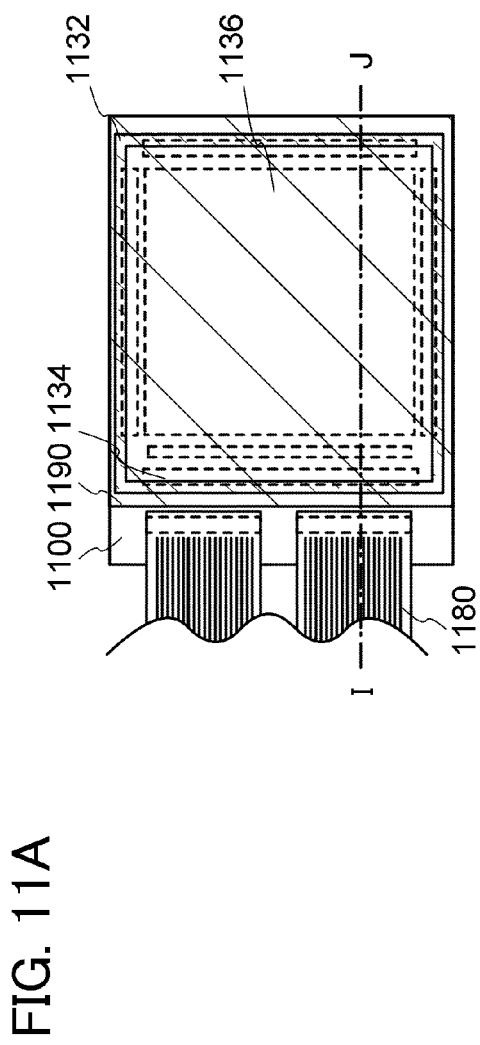
FIGS. 11A and 11B are views illustrating an example of a semiconductor device.
Figure 11B:
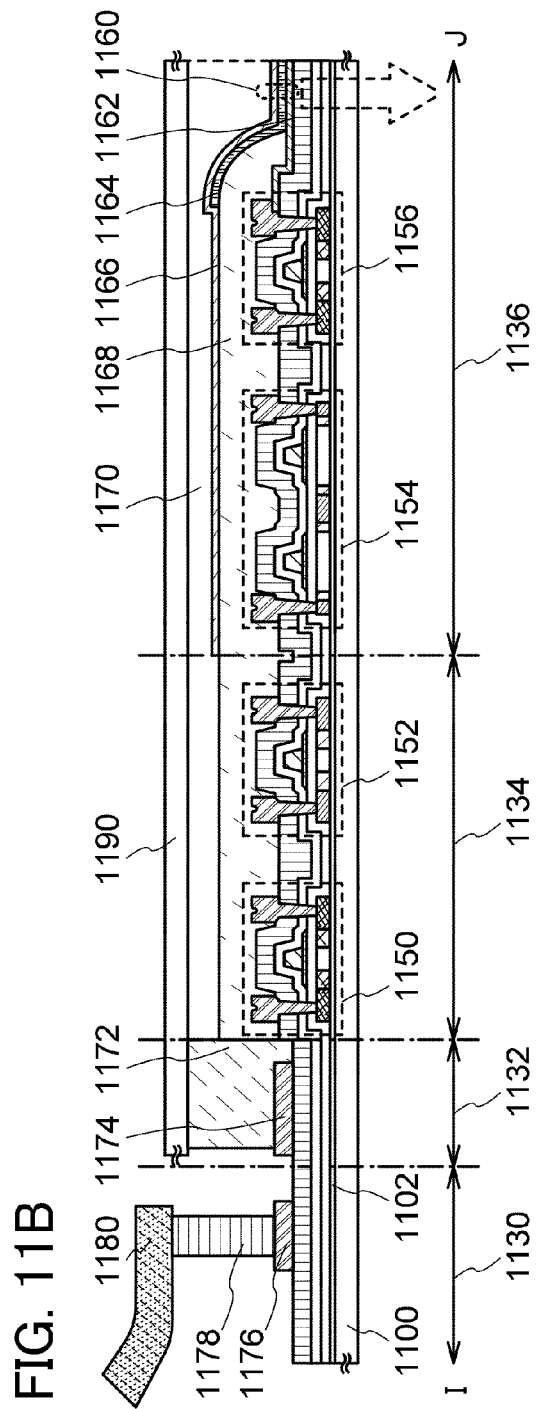

In the semiconductor device illustrated in FIGS. 11A and 11B, light is emitted downwardly (in a direction indicated by an arrow). Here, FIG. 11A is a plan view of the semiconductor device, and FIG. 11B is a cross-sectional view taken along line I-J of FIG. 11A. In FIGS. 11A and 11B, the semiconductor device includes an external terminal connection region 1130, a sealing region 1132, a driver circuit region 1134, and a pixel region 1136. Note that a thin film transistor using the microcrystalline semiconductor according to an embodiment of the invention to be disclosed is used in the pixel region 1136. A thin film transistor using the microcrystalline semiconductor can also be used in the driver circuit region 1134; however, a thin film transistor using a polycrystalline semiconductor is used in the driver circuit region 1134. In this case, by changing the energy density of a laser beam as appropriate, a polycrystalline semiconductor and a microcrystalline semiconductor can be formed separately. Needless to say, the invention is not limited to forming a driver circuit over the same substrate. A structure in which a driver circuit using a silicon substrate or an SOI substrate is separately prepared may be employed.

The semiconductor device illustrated in FIGS. 11A and 11B includes an element substrate 1100, an insulating film 1102, a thin film transistor 1150, a thin film transistor 1152, a thin film transistor 1154, a thin film transistor 1156, a light-emitting element 1160, an insulating layer 1168, a filler 1170, a sealant 1172, a wiring layer 1174, a terminal electrode layer 1176, an anisotropic conductive layer 1178, an FPC 1180, and a sealing substrate 1190. Note that the light-emitting element 1160 includes a first electrode layer 1162, a light-emitting layer 1164, and a second electrode layer 1166.

As the first electrode layer 1162, a light-transmitting conductive material is used so that light emitted from the light-emitting layer 1164 can be transmitted. On the other hand, as the second electrode layer 1166, a conductive material which can reflect light emitted from the light-emitting layer 1164 is used.

For example, as the first electrode layer 1162, indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide to which silicon oxide is added (ITSO), or the like may be used.

Alternatively, a conductive composition containing a conductive high molecule (also referred to as a conductive polymer) may be used as the first electrode layer 1162.

As the second electrode layer 1166, a conductive film containing titanium, tungsten, nickel, gold, platinum, silver, copper, tantalum, molybdenum, aluminum, magnesium, calcium, or lithium; an alloy thereof; or the like can be used. For the second electrode layer 1166, a substance having high reflectivity in a visible region is preferably used, and an aluminum film is used in this embodiment.

Note that in the case of employing each manner of top emission and dual emission, the design of the electrode layers may be changed as appropriate. Specifically, in the case of top emission, the first electrode layer 1162 is formed using a reflective material, and the second electrode layer 1166 is formed using a light-transmitting material. In the case of dual emission, the first electrode layer 1162 and the second electrode layer 1166 may be formed using a light-transmitting material. Note that in the case of bottom emission or top emission, a structure in which one electrode layer is formed using a light-transmitting material, and the other electrode layer is formed to have a layered structure of a light-transmitting material and a light reflective material may be employed. Since a material which can be used for forming the electrode layers is similar to that in the case of bottom emission, description is omitted here.

Note that even a material such as a metal film which does not have a light-transmitting property can transmit light by being formed so that its thickness is small (approximately 5 nm to 30 nm). Accordingly, an electrode layer which can transmit light can be manufactured using the above light reflective material.

The sealing substrate 1190 may be provided with a color filter (a coloring layer). The color filter (coloring layer) can be formed by an evaporation method or a droplet discharge method. Alternatively, a color conversion layer may be used.

In an embodiment of the invention to be disclosed, characteristics of a microcrystalline semiconductor layer are homogenized by irradiating the surface of the semiconductor layer with a laser beam having the energy density for complete melting. Further, since a pulsed laser beam with high output power can be used, productivity can be increased. In addition, by removing a polycrystalline region having a problem in planarity to form a thin film transistor, the characteristics can be further improved.

By employing such a thin film transistor in the invention to be disclosed as a current controlling transistor in an electroluminescent display device, luminance unevenness in each light-emitting element due to variation in characteristics among transistors can be reduced. That is, an electroluminescent display device having excellent performance can be manufactured with high productivity.

Note that an electroluminescent display device is described in this embodiment; however, the invention to be disclosed is not limited thereto. This embodiment can be implemented in combination with any of the other embodiments or example as appropriate.

Embodiment 6

Particularly, in this embodiment, an electronic device using a semiconductor device using a display device will be described with reference to FIGS. 12A to 12H.

As an electronic device manufactured using the semiconductor device according to an embodiment of the invention to be disclosed, the following can be given: a video camera, a digital camera, a goggle-type display (a head mounted display), a navigation system, an audio reproducing device (car audio components or the like), a computer, a game machine, a portable information terminal (a mobile computer, a mobile phone, a portable game machine, an electronic book, or the like), and an image reproducing device provided with a recording medium (specifically, a device which reproduces a recording medium such as a digital versatile disc (DVD) and is provided with a display that can display the image), and the like.

Figure 12A:
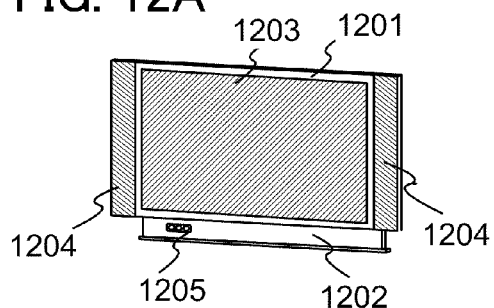
FIGS. 12A to 12H are diagrams each illustrating an electronic device using a semiconductor device.

FIG. 12A illustrates a television receiver or a monitor of a personal computer including a housing 1201, a support stand 1202, a display portion 1203, speaker portions 1204, a video input terminal 1205, and the like. The semiconductor device of the invention to be disclosed is used for the display portion 1203. According to the invention to be disclosed, a television receiver or a monitor of a personal computer with high display performance can be provided.

Figure 12B:
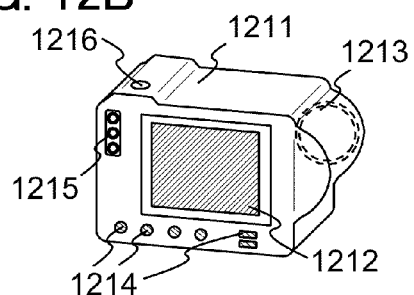

FIG. 12B illustrates a digital camera. An image receiving portion 1213 is provided on the front side of a main body 1211, and a shutter button 1216 is provided on the top side of the main body 1211. Further, a display portion 1212, operation keys 1214, and an external connection port 1215 are provided on the back side of the main body 1211. The semiconductor device of the invention to be disclosed is used for the display portion 1212. According to the invention to be disclosed, a digital camera with high display performance can be provided.

Figure 12C:
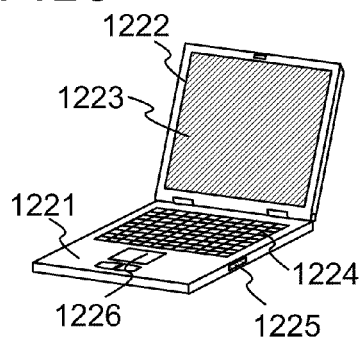

FIG. 12C illustrates a laptop personal computer. A main body 1221 is provided with a keyboard 1224, an external connection port 1225, and a pointing device 1226. Further, a housing 1222 having a display portion 1223 is attached to the main body 1221. The semiconductor device according to an embodiment of the invention to be disclosed is used for the display portion 1223. According to the invention to be disclosed, a laptop personal computer with high display performance can be provided.

Figure 12D:
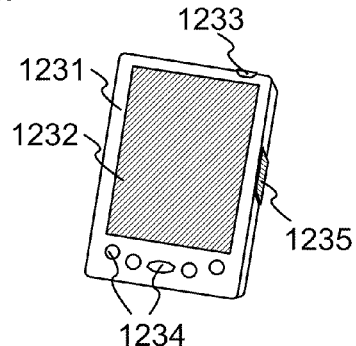

FIG. 12D illustrates a mobile computer, which includes a main body 1231, a display portion 1232, a switch 1233, operation keys 1234, an infrared port 1235, and the like. An active matrix display device is provided in the display portion 1232. A semiconductor device according to an embodiment of the invention to be disclosed is used in the display portion 1232. According to the invention to be disclosed, a mobile computer with high display performance can be provided.

Figure 12E:
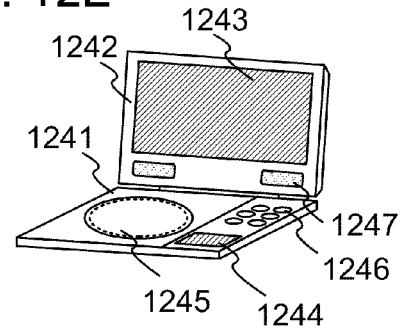

FIG. 12E illustrates an image reproduction device. A main body 1241 is provided with a display portion 1244, a storage media reading portion 1245, and an operation key 1246. Further, a housing 1242 having both a speaker portion 1247 and a display portion 1243 is attached to the main body 1241. A semiconductor device according to an embodiment of the invention to be disclosed is used in each of the display portions 1243 and 1244. According to the invention to be disclosed, an image reproduction device with high display performance can be provided.

Figure 12F:
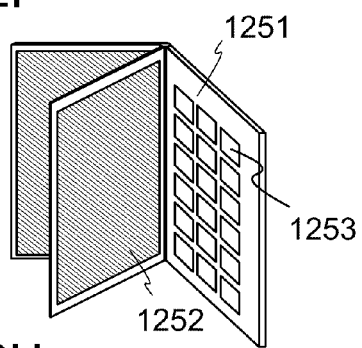

FIG. 12F illustrates an electronic book. A main body 1251 is provided with an operation key 1253. Further, a plurality of display portions 1252 is attached to the main body 1251. The semiconductor device according to an embodiment of the invention to be disclosed is used for the display portions 1252. According to the invention to be disclosed, an electronic book with high display performance can be provided.

Figure 12G:
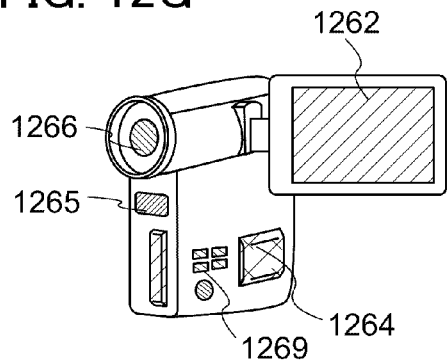

FIG. 12G illustrates a video camera including a display portion 1262, an external connection port 1264, a remote control receiving portion 1265, an image receiving portion 1266, an operation key 1269, and the like. A semiconductor device according to an embodiment of the invention to be disclosed is used for the display portion 1262. According to the invention to be disclosed, a video camera with high display performance can be provided.

Figure 12H:
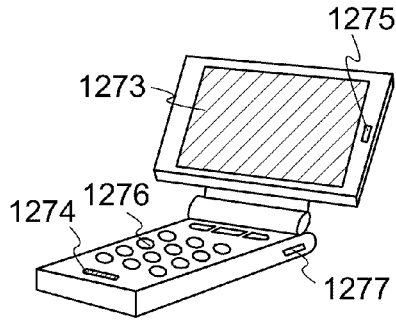

FIG. 12H illustrates a mobile phone, which includes a display portion 1273, an audio input portion 1274, an audio output portion 1275, an operation key 1276, an external connection port 1277, and the like. In addition, the mobile phone may have a structure in which an infrared communication function, a television receiver function, or the like is further provided. A semiconductor device according to an embodiment of the invention to be disclosed is used for the display portion 1273. According to the invention to be disclosed, a mobile phone with high display performance can be provided.

As described above, the application range of the invention to be disclosed is extremely wide and the invention to be disclosed can be used for electronic devices in various fields. This embodiment can be implemented in combination with any of the other embodiments or example as appropriate.

EXAMPLE 1

In this example, measurement results of crystallization states of semiconductor films due to difference in temperature of treatment atmosphere will be described.

First, a plurality of glass substrates was prepared. A silicon nitride oxide film was formed to a thickness of 50 nm over each of the glass substrates, and a silicon oxynitride film was formed to a thickness of 100 nm over the silicon nitride oxide film. After that, an amorphous silicon film was formed to a thickness of 50 nm over the silicon oxynitride film. Next, after the plurality of glass substrates each provided with the amorphous silicon film was introduced into treatment atmospheres which were set at different temperature conditions, individually, and crystallization occurred, surfaces of the semiconductor films and a state of crystal grains of part of the semiconductor films were observed. Further, a Raman spectrum of each sample was measured. Note that a sample on which heat treatment was not performed was prepared and observed in a similar manner for comparison.

Note that five conditions of 650° C., 675° C., 700° C., 725° C., and 750° C. were set as the above temperature conditions in this example. Further, in order to observe a crystallization state of a semiconductor film in an early stage of crystallization, a period of heat treatment time (a period until the glass substrate was taken out after the glass substrate was introduced into a treatment atmosphere) was set to 6 minutes.

FIGS. 13A to 13F show images observed with an optical microscope (transmission optical microscope) of the silicon films after crystallization treatment under the temperature conditions. Since crystalline silicon has higher transmissivity than amorphous silicon, the degree of crystallization can be examined by use of this. In the optical microscope image, a bright portion is a region which is crystallized and a dark portion is a region which is not crystallized.

Figure 13A:
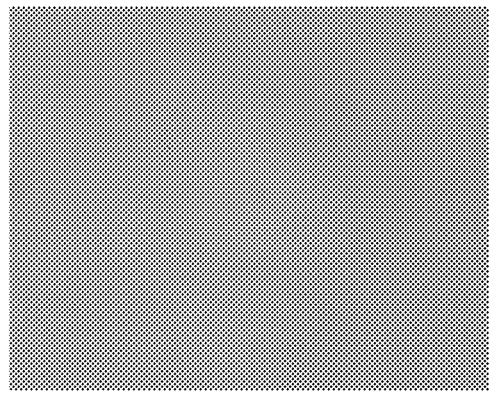
FIGS. 13A to 13F are optical microscope images of silicon films after crystallization treatment.

FIG. 13A shows an optical microscope image of the sample on which heat treatment was not performed. It can be seen that an entire surface is dark and the silicon film is amorphous.

Figure 13B:
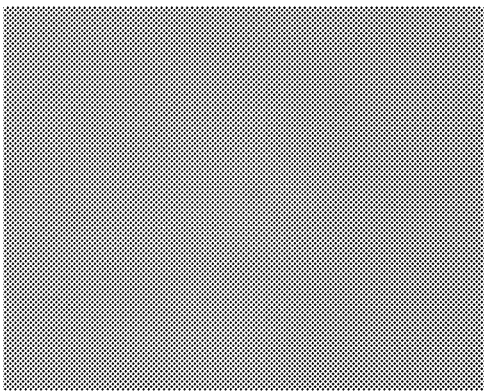
Figure 13C:
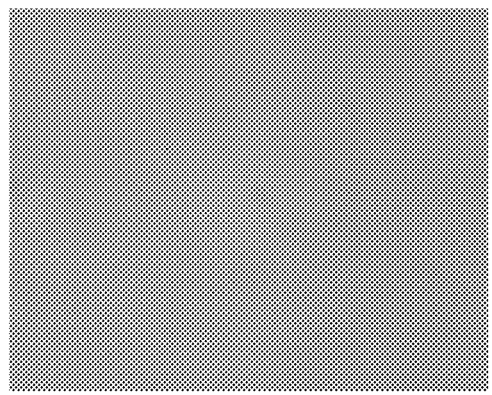

FIG. 13B shows an optical microscope image of the silicon film on which heat treatment was performed at 650° C. An entire surface was dark, and the silicon film was hardly crystallized. FIG. 13C shows an optical microscope image of the silicon film on which heat treatment was performed at 675° C., and similarly, the silicon film was hardly crystallized.

Figure 13D:
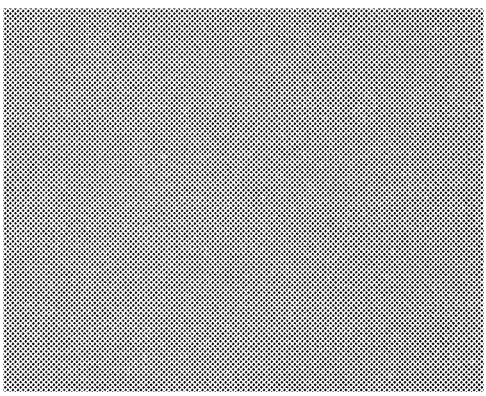

FIG. 13D shows an optical microscope image of the silicon film on which heat treatment was performed at 700° C. Most part was dark; however, there was a bright point in a part. That is, it can be said that crystal nuclei were slightly generated in a silicon film and crystallization progressed under a temperature condition of 700° C.

Figure 13E:
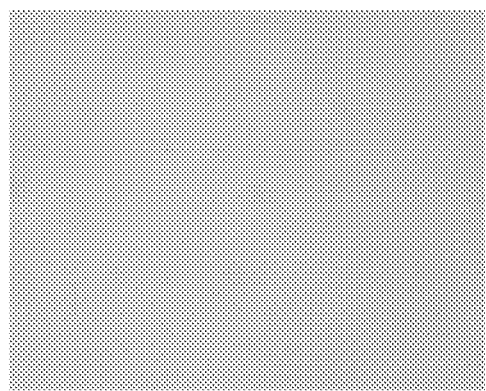
Figure 13F:
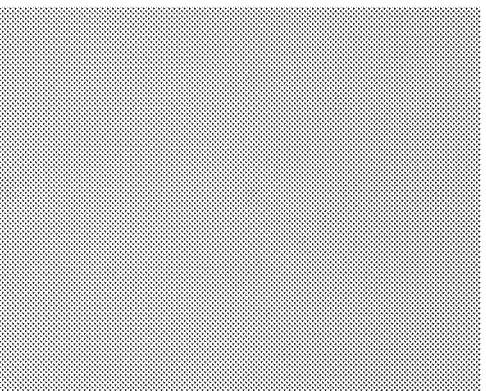

FIG. 13E shows an optical microscope image of the silicon film on which crystallization treatment was performed at 725° C. An entire surface was bright in contrast to that in FIG. 13C or the like. That is, it can be said that crystallization of the silicon film progressed sufficiently under a temperature condition of 725° C. FIG. 13F shows an optical microscope image of the silicon film on which crystallization treatment was performed at 750° C., and similarly, the silicon film was sufficiently crystallized.

Figure 14A:
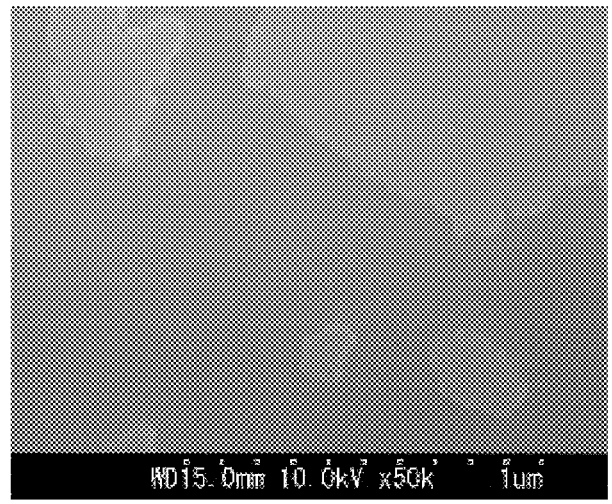
FIGS. 14A to 14C are SEM images of silicon films on which seco etching is performed after crystallization treatment.
Figure 14B:
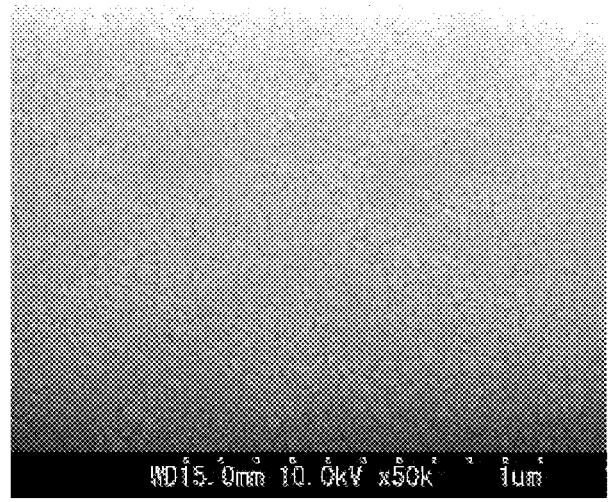
Figure 14C:
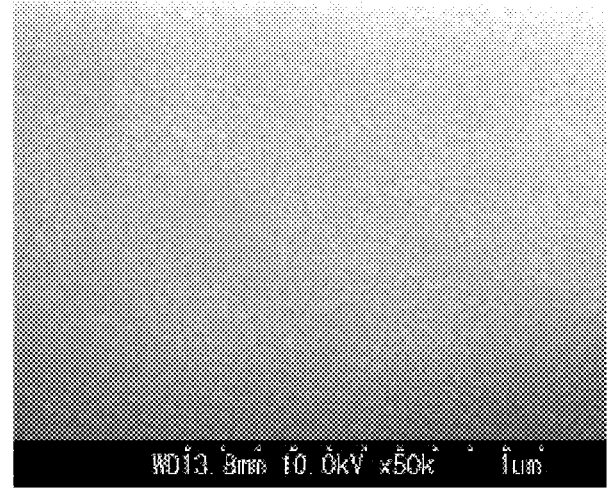

FIGS. 14A to 14C show SEM (scanning electron microscope) images after performing seco etching on samples of the conditions 700° C., 725° C., and 750° C. Note that seco etching is etching performed for exposing crystal grain boundaries on a surface of a crystalline semiconductor film.

FIG. 14A shows a SEM image of the sample on which heat treatment was performed at 700° C. Crystal growth occurred partially, so that crystallization did not progress homogeneously on the entire surface of the silicon film.

FIG. 14B shows a SEM image of the sample on which heat treatment was performed at 725° C. It can be seen that the size of crystal grains is even and a favorable crystalline silicon film is obtained. FIG. 14C shows a SEM image of the sample on which heat treatment was performed at 750° C., and a favorable crystalline silicon film is obtained as in FIG. 14B.

Figure 15:
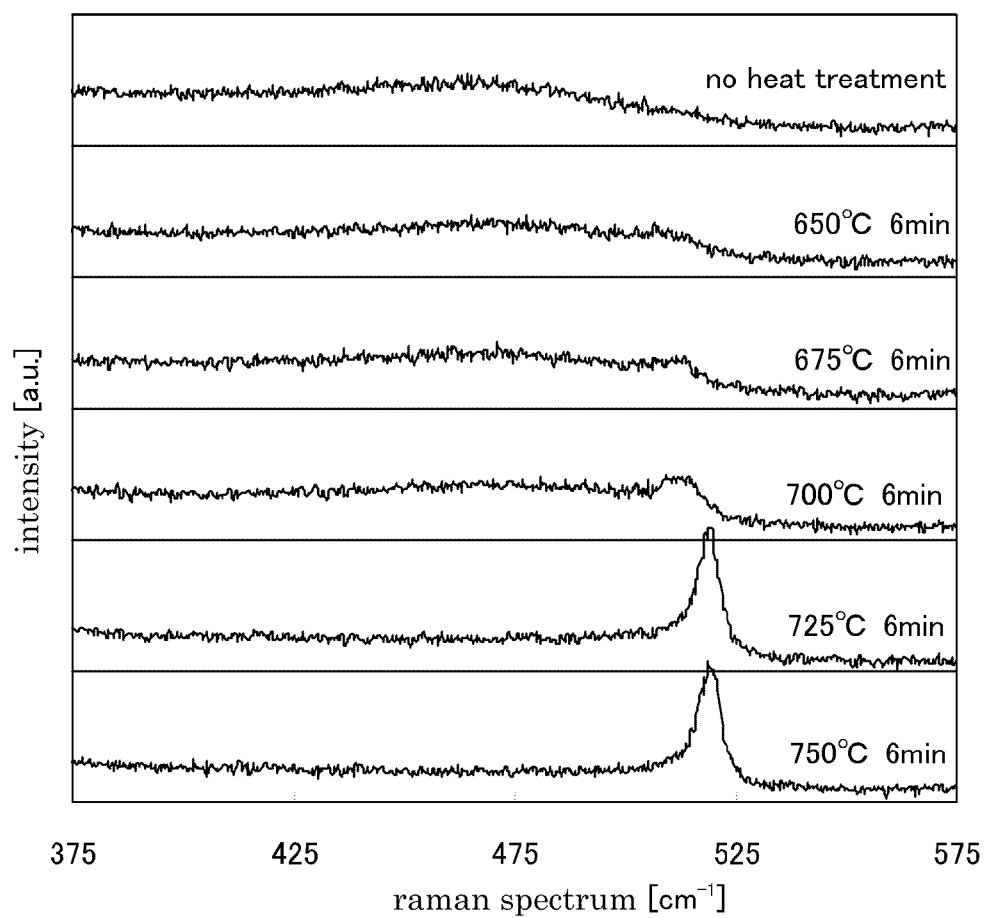
FIG. 15 is a graph showing Raman spectra of silicon films after crystallization treatment.

FIG. 15 shows results of Raman spectrum measurement of the samples. The horizontal axis indicates the Raman spectrum ($cm^{-1}$), and the vertical axis indicates the intensity (arbitral unit). As for the sample on which heat treatment was performed under a temperature condition of 725° C. or 750° C., a peak was observed near 520 $cm^{-1}$, and it can be seen that favorable crystalline silicon films were obtained.

As in an embodiment of the invention to be disclosed, by introducing an amorphous silicon film into a treatment atmosphere which is set at more than or equal to a predetermined temperature (a temperature necessary for crystallization) in advance to perform heat treatment, a number of nuclei can be generated on an entire surface of the silicon film in the early stage of crystallization and the crystallization can proceed. As a result, a homogeneous crystalline semiconductor film in which variation in the size of crystal grains is reduced can be manufactured.

This embodiment can be implemented in combination with any of the embodiments as appropriate.

This application is based on Japanese Patent Application serial no. 2008-228134 filed with Japanese Patent Office on Sep. 5, 2008, the entire contents of which are hereby incorporated by reference.

What is claimed is:

1. A method for manufacturing a semiconductor device comprising the steps of:
   forming an amorphous semiconductor film over a glass substrate;
   setting a temperature of an atmosphere to which the glass substrate is introduced at 725° C. or more; and
   introducing the glass substrate into the atmosphere after setting the temperature of the atmosphere at 725° C. or more,
   wherein, in the atmosphere, a temperature of a supporting base which is in contact with the glass substrate is 725° C. or more.

2. The method for manufacturing the semiconductor device according to claim 1, wherein the temperature of the atmosphere to which the glass substrate is introduced is set at higher than or equal to 725° C. and lower than a strain point of the glass substrate.

3. The method for manufacturing the semiconductor device according to claim 1, wherein the temperature of the atmosphere to which the glass substrate is introduced is higher than or equal to 725° C. and higher than or equal to a strain point of the glass substrate.

4. The method for manufacturing the semiconductor device according to claim 1, wherein the atmosphere to which the glass substrate is introduced contains at least any one of hydrogen, helium, or water vapor.

5. The method for manufacturing the semiconductor device according to claim 1, wherein the temperature of the atmosphere to which the glass substrate is introduced is held by radiant heat.

6. The method for manufacturing the semiconductor device according to claim 1, wherein a strain point of the glass substrate is 730° C. or more.

7. The method for manufacturing the semiconductor device according to claim 1, wherein the glass substrate contains BaO and $B_2O_3$ so that an amount of BaO is larger than that of $B_2O_3$.

8. A method for manufacturing a semiconductor device comprising the steps of:
   forming an amorphous semiconductor film over a glass substrate;
   setting a temperature of an atmosphere to which the glass substrate is introduced at 725° C. or more;
   introducing the glass substrate into the atmosphere after setting the temperature of the atmosphere at 725° C. or more;
   holding the glass substrate for a predetermined time in the atmosphere to crystallize the amorphous semiconductor film; and
   taking the glass substrate out of the atmosphere.

9. The method for manufacturing a semiconductor device, according to claim 8, wherein the predetermined time is longer than or equal to 1 minute and shorter than or equal to 10 minutes.

10. The method for manufacturing a semiconductor device, according to claim 8, wherein the holding is conducted at the temperature which is lower than a strain point of the glass substrate.

11. The method for manufacturing the semiconductor device according to claim 8, wherein the temperature of the atmosphere to which the glass substrate is introduced is set at higher than or equal to 725° C. and lower than a strain point of the glass substrate.

12. The method for manufacturing the semiconductor device according to claim 8, wherein the temperature of the atmosphere to which the glass substrate is introduced is higher than or equal to 725° C. and higher than or equal to a strain point of the glass substrate.

13. The method for manufacturing the semiconductor device according to claim 8, wherein the atmosphere to which the glass substrate is introduced contains at least any one of hydrogen, helium, or water vapor.

14. The method for manufacturing the semiconductor device according to claim 8, wherein the temperature of the atmosphere to which the glass substrate is introduced is held by radiant heat.

15. The method for manufacturing the semiconductor device according to claim 8, wherein a strain point of the glass substrate is 730° C. or more.

16. The method for manufacturing the semiconductor device according to claim 8, wherein the glass substrate contains BaO and $B_2O_3$ so that an amount of BaO is larger than that of $B_2O_3$.

17. A method for manufacturing a semiconductor device comprising the steps of:
forming an amorphous semiconductor film over a glass substrate;
supplying a gas such as nitrogen, oxygen, or a rare gas to a treatment chamber from a gas supply source;
setting a temperature of an atmosphere to which the glass substrate is introduced at 725° C. or more, wherein the atmosphere is in the treatment chamber;
introducing the glass substrate into the atmosphere after setting the temperature of the atmosphere at 725° C. or more;
holding the glass substrate for a predetermined time in the treatment chamber to crystallize the amorphous semiconductor film; and
taking the glass substrate out of the treatment chamber.

18. The method for manufacturing a semiconductor device, according to claim 17, wherein the predetermined time is longer than or equal to 1 minute and shorter than or equal to 10 minutes.

19. The method for manufacturing a semiconductor device, according to claim 17, wherein the holding is conducted at the temperature which is lower than a strain point of the glass substrate.

20. The method for manufacturing the semiconductor device according to claim 17, wherein the temperature of the atmosphere to which the glass substrate is introduced is set at higher than or equal to 725° C. and lower than a strain point of the glass substrate.

21. The method for manufacturing the semiconductor device according to claim 17, wherein the temperature of the atmosphere to which the glass substrate is introduced is higher than or equal to 725° C. and higher than or equal to a strain point of the glass substrate.

22. The method for manufacturing the semiconductor device according to claim 17, wherein the atmosphere to which the glass substrate is introduced contains at least any one of hydrogen, helium, or water vapor.

23. The method for manufacturing the semiconductor device according to claim 17, wherein the temperature of the atmosphere to which the glass substrate is introduced is held by radiant heat.

24. The method for manufacturing the semiconductor device according to claim 17, wherein a strain point of the glass substrate is 730° C. or more.

25. The method for manufacturing the semiconductor device according to claim 17, wherein the glass substrate contains BaO and $B_2O_3$ so that an amount of BaO is larger than that of $B_2O_3$.

26. The method for manufacturing the semiconductor device according to claim 1, wherein, in the amorphous semiconductor film, a catalytic element for crystallization is not contained intentionally.

27. The method for manufacturing the semiconductor device according to claim 8, wherein, in the amorphous semiconductor film, a catalytic element for crystallization is not contained intentionally.

28. The method for manufacturing the semiconductor device according to claim 8, wherein, in the atmosphere, a temperature of a supporting base which is in contact with the glass substrate is 725° C. or more.

29. The method for manufacturing the semiconductor device according to claim 17, wherein, in the amorphous semiconductor film, a catalytic element for crystallization is not contained intentionally.

30. The method for manufacturing the semiconductor device according to claim 17, wherein, in the atmosphere, a temperature of a supporting base which is in contact with the glass substrate is 725° C. or more.

31. A method for manufacturing a semiconductor device comprising the steps of:
forming an amorphous semiconductor film over a glass substrate;
setting a temperature of a supporting base of a substrate provided in a treatment chamber at 725° C. or more; and
introducing the glass substrate into the treatment chamber and setting the substrate on the supporting base after setting the temperature of the supporting base at 725° C. or more.

32. The method for manufacturing the semiconductor device according to claim 31, wherein the temperature of the supporting base is set at higher than or equal to 725° C. and lower than a strain point of the glass substrate.

33. The method for manufacturing the semiconductor device according to claim 31, wherein the temperature of the supporting base is higher than or equal to 725° C. and higher than or equal to a strain point of the glass substrate.

34. The method for manufacturing the semiconductor device according to claim 31, wherein an atmosphere in the treatment chamber contains at least any one of hydrogen, helium, or water vapor.

35. The method for manufacturing the semiconductor device according to claim 31, wherein a strain point of the glass substrate is 730° C. or more.

36. The method for manufacturing the semiconductor device according to claim 31, wherein the glass substrate contains BaO and $B_2O_3$ so that an amount of BaO is larger than that of $B_2O_3$.

37. The method for manufacturing the semiconductor device according to claim 31, wherein, in the amorphous semiconductor film, a catalytic element for crystallization is not contained intentionally.

* * * * *